United States Patent [19]

Matsunaga et al.

[11] Patent Number: 6,091,449
[45] Date of Patent: Jul. 18, 2000

[54] MOS-TYPE SOLID-STATE IMAGING APPARATUS

[75] Inventors: Yoshiyuki Matsunaga, Kamakura; Shinji Ohsawa, Ebina; Nobuo Nakamura, Funchu; Hirofumi Yamashita, Tokyo; Hiroki Miura; Nagataka Tanaka, both of Yokohama; Keiji Mabuchi, Kawasaki, all of Japan

[73] Assignee: Kabushiki Kaisha Toshiba, Kawasaki, Japan

[21] Appl. No.: 09/021,940

[22] Filed: Feb. 11, 1998

Related U.S. Application Data

[63] Continuation of application No. PCT/JP96/02281, Aug. 12, 1996, abandoned.

[30] Foreign Application Priority Data

| Aug. 11, 1995 | [JP] | Japan | 7-206140 |
| Aug. 11, 1995 | [JP] | Japan | 7-206143 |
| Mar. 11, 1996 | [JP] | Japan | 8-053220 |
| Mar. 15, 1996 | [JP] | Japan | 8-059845 |

[51] Int. Cl.$^7$ .......................... H04N 3/14; H01L 31/062
[52] U.S. Cl. .......................... 348/308; 348/301; 348/311; 257/292
[58] Field of Search ............................ 348/301, 302, 348/303, 304, 307, 308, 317, 311; 250/208.1; 257/225, 231, 233, 290, 291, 375, 292, 293, 482, 461

[56] References Cited

U.S. PATENT DOCUMENTS

| 4,611,223 | 9/1986 | Hine et al. ............................. | 348/308 |
| 4,809,075 | 2/1989 | Akimoto et al. . | |
| 4,819,070 | 4/1989 | Hynecek . | |
| 4,942,474 | 7/1990 | Akimoto et al. . | |
| 4,984,047 | 1/1991 | Stevens ................................... | 257/223 |
| 5,144,447 | 9/1992 | Akimoto et al. . | |
| 5,172,249 | 12/1992 | Hashimoto . | |
| 5,274,459 | 12/1993 | Hamasaki ............................. | 348/249 |
| 5,335,008 | 8/1994 | Hamasaki ............................. | 348/308 |
| 5,401,952 | 3/1995 | Sugawa ................................. | 348/308 |
| 5,438,365 | 8/1995 | Yamashita et al. .................... | 348/317 |
| 5,541,654 | 7/1996 | Roberts ................................. | 348/301 |
| 5,739,851 | 4/1998 | Oshawa et al. ....................... | 348/311 |
| 5,796,431 | 8/1998 | Yonemoto ............................. | 348/308 |
| 5,808,677 | 9/1998 | Yonemoto ............................. | 348/308 |

FOREIGN PATENT DOCUMENTS

| 62-213485 | 9/1987 | Japan . | |
| 5-207220 | 8/1993 | Japan . | |
| 5-207376 | 8/1993 | Japan . | |
| 6-151846 | 5/1994 | Japan .................................... | 257/375 |
| WO97/07630 | 2/1997 | WIPO . | |

OTHER PUBLICATIONS

Chamberlain, Savvas G. "Photosensitivity and Scanning of Silicon Image Detector Arrays." IEEE, Journal of Solid–State Circuits, vol. SC–4, No. 6, Dec. 1969, pp. 333–342.

*Primary Examiner*—Wendy Garber
*Assistant Examiner*—Luong Nguyen
*Attorney, Agent, or Firm*—Oblon, Spivak, McClelland, Maier & Neustadt, P.C.

[57] ABSTRACT

In an MOS-type solid-state imaging apparatus, plural unit cells are arranged in a two-dimensional matrix, unit cells in one horizontal line (row) are selected by a vertical address circuit, and vertical signal lines to which outputs from the unit cells in one vertical line (column) are supplied are selected by a horizontal address circuit, thereby sequentially outputting signals from the respective unit cells. Each unit cell includes an output circuit for outputting an output from a photodiode to a vertical signal line, photodiodes connected in parallel to the output circuit, and a selection switch for selecting one of the photodiodes and connecting it to the output circuit. The output circuit comprising an amplification transistor for amplifying an output from the photodiode, a selection transistor for selecting the unit cell, and a reset transistor for resetting the charge in the photodiode.

28 Claims, 29 Drawing Sheets

MOS-TYPE SOLID-STATE IMAGING APPARATUS

CROSS-REFERENCE TO THE RELATED APPLICATIONS

This is a continuation application of Application No. PCT/JP96/02281, filed Aug. 12, 1996, now abandoned.

BACKGROUND OF THE INVENTION

1. Field of the Invention

The present invention relates to a solid-state imaging apparatus using an amplification-type MOS sensor for amplifying signal charges within cells.

2. Discussion of the Background

Recently, compact video cameras and high-resolution, high-vision solid-state imaging apparatuses have been developed. Strong demands have arisen for not only compact cameras and solid-state imaging apparatuses but also low-power-consumption, low-voltage solid-state imaging apparatuses as portable cameras and personal computer cameras.

As the chip size of a solid-state imaging apparatus decreases, however, the amount of signal charge to be processed decreases due to micropatterning. As a result, the dynamic range of the solid-state imaging apparatus narrows, and hence a clear, high-resolution video cannot be obtained. In addition, since many power supply voltages having two, three, or more values are used, a simple system cannot be coped with in terms of camera system configuration and handling. That is, for application to portable cameras and personal computer cameras, a solid-state imaging apparatus which attains a high S/N ratio and uses a single power supply, and also attains reductions in power consumption and voltage is required.

To solve this problem, several amplification-type solid-state imaging apparatuses using transistors have been proposed. These solid-state imaging apparatuses are designed to cause transistors to amplify signals detected by photodiodes in the respective cells, and are characterized by having a high sensitivity.

FIG. 1 is a circuit diagram showing the arrangement of a conventional solid-state imaging apparatus using an amplification-type MOS sensor. Unit cells P0-i-j are arranged in the form of a two-dimensional matrix. Although FIG. 1 shows only a 2×2 matrix, the actual apparatus has several thousand cells×several thousand cells. Reference symbol i denotes a variable in the horizontal (row) direction; and j, a variable in the vertical (column) direction. Each unit cell P0-i-j is constituted by a photodiode 1-i-j for detecting incident light, an amplification transistor 2-i-j having a gate to which the cathode of the photodiode 1-i-j is connected and designed to amplify the detection signal, a vertical selection transistor 3-i-j connected to the drain of the amplification transistor 2-i-j to select a horizontal line for reading out the signal, and a reset transistor 4-i-j connected to the cathode of the photodiode 1-i-j to reset the signal charge. The source of the vertical selection transistor 3-i-j and the source of the reset transistor 4-i-j are commonly connected to a drain voltage terminal.

Vertical address lines 6-1, 6-2, . . . horizontally extending from a vertical address circuit 5 are connected to the gates of vertical selection transistors 3-1-1, . . . of the unit cells in the respective rows to determine horizontal lines for reading out signals. Similarly, reset lines 7-1, 7-2, . . . horizontally extending from the vertical address circuit 5 are connected to the gates of reset transistors 4-1-1, . . . in the respective rows.

The sources of amplification transistors 2-1-1, . . . of the unit cells in the respective rows are connected to vertical signal lines 8-1, 8-2, . . . arranged in the column direction. Each of load transistors 9-1, 9-2, . . . is connected to one end of a corresponding one of the vertical signal lines 8-1, 8-2, . . . A signal output terminal (horizontal signal line) 15 is connected to the other end of each of the vertical signal lines 8-1, 8-2, . . . through horizontal selection transistors 12-1, 12-2, . . . which are driven by horizontal address pulses output from a horizontal address circuit 13.

The operation of this device will be described with reference to a timing chart shown in FIG. 2.

When a high-level address pulse is applied to the vertical address line 6-i, only the vertical selection transistors 3-i-1, 3-i-2, . . . in this line are turned on. As a result, source follower circuits are constituted by the amplification transistors 2-i-1, 2-i-2, . . . and the load transistors 9-i-1, 9-i-2, . . . in this line.

With this operation, the gate voltages of the amplification transistors 2-i-1, 2-i-2, . . . , i.e., almost the same voltages as those of the photodiodes 1-i-1, 1-i-2, . . . , appear on the vertical signal lines 8-i-1, 8-i-2, . . .

When a signal transfer pulse is applied to a common gate 14 of signal transfer transistors 10-1, 10-2, . . . , an amplified signal charge corresponding to a product of voltages appears on the vertical signal lines 8-i-1, 8-i-2, . . . and their capacitances appear on amplified signal storage capacitors 11-1, 11-2, . . .

After the signal charges are stored in the amplified signal storage capacitors 11-1, 11-2, . . . and the signal transfer transistors 10-1, 10-2, . . . are turned off, reset pulses are applied to the reset lines 7-1, 7-2, . . . to turn off the reset transistors 4-i-1, 4-i-2, . . . With this operation, the signal charges stored in the photodiodes 1-i-1, 1-i-2, . . . are reset.

Horizontal address pulses are sequentially applied from the horizontal address circuit 13 to the horizontal selection transistors 12-1, 12-2, . . . to sequentially output signals corresponding to lines (rows) from the signal output terminal 15.

By sequentially performing this operation for the subsequent lines, all the signals in the two-dimensional matrix can be read out.

Each unit cell P0-i-j in a solid-state imaging apparatus using an amplification-type MOS sensor of this type, requires at least three transistors, i.e., the amplification transistor 2-i-j for amplifying a charge signal from the photodiode 1-i-j, the vertical selection transistor 3-i-j for selecting a line to read a signal, and the reset transistor 4-i-j for charging/discharging the gate of the amplifying transistor. Therefore, it is difficult to miniaturize the unit cell and the imaging device itself.

BRIEF SUMMARY OF THE INVENTION

It is an object of the present invention to provide an MOS-type solid-state imaging apparatus which allows a reduction in size.

According to a first aspect of the present invention, there is provided an MOS-type solid-state imaging apparatus comprising unit cells arranged in an array; means for selecting one of the unit cells, wherein each of the unit cells comprises photoelectric converters; plural selection means respectively connected to the photoelectric converters and selecting one of output signals from the photoelectric converters; and output means for receiving one of the output signals from the photoelectric converters which is selected by the plurality of selection means, amplifying the output signal, and outputting an amplified signal.

According to a second aspect of the present invention, in the MOS-type solid-state imaging apparatus according to the first aspect, the photoelectric converters are connected in parallel to the output means.

According to a third aspect of the present invention, in the MOS-type solid-state imaging apparatus according to the second aspect, the photoelectric converters are connected in series to the output means.

According to a fourth aspect of the present invention, in the MOS-type solid-state imaging apparatus according to the first aspect, the unit cells are arranged in a two-dimensional matrix, and the photoelectric converters are arrayed in the vertical direction in the unit cell.

According to a fifth aspect of the present invention, the MOS-type solid-state imaging apparatus according to the fourth aspect further comprises vertical selection means for selecting a row of the unit cells and controlling the selection means, and horizontal selection means for selecting a column of the unit cells.

According to a sixth aspect of the present invention, in the MOS-type solid-state imaging apparatus according to the first aspect, the unit cells are arranged in a two-dimensional matrix, and the photoelectric converters are arrayed in the horizontal direction in the unit cell.

According to a seventh aspect of the present invention, the MOS-type solid-state imaging apparatus according to the sixth aspect further comprises vertical selection means for selecting a row of the unit cells and controlling the selection means, and horizontal selection means for selecting a column of the unit cells.

According to an eighth aspect of the present invention, in the MOS-type solid-state imaging apparatus according to the first aspect, the unit cells are arranged in a two-dimensional matrix, and the photoelectric converters are arranged in a two-dimensional matrix in the unit cell.

According to a ninth aspect of the present invention, the MOS-type solid-state imaging apparatus according to the eighth aspect further comprises vertical selection means for selecting a row of the unit cells and controlling the selection means, and horizontal selection means for selecting a column of the unit cells.

According to a tenth aspect of the present invention, in the MOS-type solid-state imaging apparatus according to the first aspect, the unit cells are arranged in a one-dimensional array, and the photoelectric converters are arrayed in a direction perpendicular to the array of the unit cells in the unit cell.

According to an eleventh aspect of the present invention, in the MOS-type solid-state imaging apparatus according to the first aspect, the unit cells are arranged in a one-dimensional array, and the photoelectric converters are arrayed in a direction parallel to the array of the unit cells in the unit cell.

According to a twelfth aspect of the present invention, in the MOS-type solid-state imaging apparatus according to the first aspect, the unit cells are arranged in a one-dimensional array, and the photoelectric converters are arranged in the form of a matrix in the unit cell.

According to a thirteenth aspect of the present invention, in the MOS-type solid-state imaging apparatus according to the first aspect, the unit cell comprising an amplification transistor for amplifying one of the output signals from the photoelectric converters which is selected by the plural selection means, a reset transistor for resetting the output signal from the photoelectric converter, and a selection transistor for selecting the amplification transistor.

According to a second aspect of the present invention, in the MOS-type solid-state imaging apparatus according to the first aspect, the unit cell comprising an amplification transistor for amplifying one of the output signals from the photoelectric converters which is selected by the plural selection means, a reset transistor for resetting the output signal from the photoelectric converter, and a selection capacitor for selecting the amplification transistor.

According to a fifteenth aspect of the present invention, there is provided an MOS-type solid-state imaging apparatus comprising unit cells formed on a semiconductor substrate, wherein the semiconductor substrate comprises a $p^-$-type impurity base layer and a $p^+$-type impurity layer formed thereon, and the unit cells are formed in the $p^+$-type impurity layer.

According to a sixteenth aspect of the present invention, there is provided an MOS-type solid-state imaging apparatus comprising unit cells formed on a semiconductor substrate, wherein the semiconductor substrate comprises a $p^-$-type impurity base layer and a $p^+$-type impurity layer formed thereon, and the unit cell comprises photoelectric converters, plural selection means respectively connected to the photoelectric converters and selecting one of output signals from the photoelectric converters, and output means for receiving one of the output signals from the photoelectric converters which is selected by the plural selection means, amplifying the output signal, and outputting an amplified signal.

According to a seventeenth aspect of the present invention, there is provided a driving method for an MOS-type solid-state imaging apparatus comprising unit cells formed on a surface region of a semiconductor substrate, the unit cell comprising photoelectric converters for generating charges corresponding to incident light and signal output means to which the photoelectric converters are connected in parallel and which outputs a voltage signal corresponding to a charge generated by one of the photoelectric converters, in which the signal output means performs an operation of outputting the voltage signal at least twice in one frame interval of a television signal.

According to an eighteenth aspect of the present invention, the MOS-type solid-state imaging apparatus according to the first aspect, further comprises means for compensating for variations in amplification characteristics of the output means of the unit cells.

According to a nineteenth aspect of the present invention, in the MOS-type solid-state imaging apparatus according to the eighth aspect, the compensation means comprises a noise canceler for subtracting a noise component from an output from the unit cell.

According to a twentieth aspect of the present invention, in the MOS-type solid-state imaging apparatus according to the eighth aspect, the compensation means comprises a noise canceler for subtracting a charge representing a noise component from a charge representing an output from the unit cell.

According to a twenty-first aspect of the present invention, in the MOS-type solid-state imaging apparatus according to the eighth aspect, the compensation means comprises a source follower circuit to which an output signal from the unit cell is supplied, a sample/hold capacitor to which an output signal from the source follower circuit is supplied through a sample/hold transistor and a clamp capacitor, and the sample/hold transistor connected to a connection point between the sample/hold capacitor and the clamp capacitor to turn on/off the connection point.

According to a twenty-second aspect of the present invention, in the MOS-type solid-state imaging apparatus according to the twenty-first aspect, the sample/hold capacitor and the clamp capacitor are stacked on each other.

According to a twenty-third aspect of the present invention, in the MOS-type solid-state imaging apparatus according to the eighth aspect, the compensation means comprises a sample/hold capacitor to which an output signal from the unit cell is supplied through a clamp capacitor and a sample/hold transistor, and a clamp transistor connected to a connection point between the clamp capacitor and the sample/hold transistor to turn on/off the clamp capacitor.

According to a twenty-fourth aspect of the present invention, in the MOS-type solid-state imaging apparatus according to the twenty-third aspect, the compensation means comprises correction means for reducing a difference between impedances of the clamp capacitor in ON and OFF periods.

According to a twenty-fifth aspect of the present invention, in the MOS-type solid-state imaging apparatus according to the twenty-fourth aspect, the correction means comprises a correction capacitor for increasing the clamp capacitor when the clamp transistor is off.

According to a twenty-sixth aspect of the present invention, in the MOS-type solid-state imaging apparatus according to the eighth aspect, the compensation means comprises a source follower circuit to which an output signal from the unit cell is supplied, a sample/hold capacitor to which an output signal from the source follower circuit is supplied through a clamp capacitor and a sample/hold transistor, and a clamp transistor connected to a connection point between the clamp capacitor and the sample/hold transistor to turn on/off the clamp capacitor.

According to a twenty-seventh aspect of the present invention, in the MOS-type solid-state imaging apparatus according to the eighth aspect, the compensation means comprises a slice transistor having a gate to which an output signal from the unit cell is supplied, a slice capacitor and a slice reset transistor which are connected to a source of the slice transistor, and a slice charge transfer capacitor and a drain reset transistor which are connected to a drain of the slice transistor.

According to a twenty-eighth aspect of the present invention, in the MOS-type solid-state imaging apparatus according to the eighth aspect, the compensation means comprises a sample/hold capacitor to which an output signal from the unit cell is supplied through a sample/hold transistor and a clamp capacitor, and the sample/hold transistor connected to a connection point between the sample/hold capacitor and the clamp capacitor to turn on/off the connection point.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention, in which.

DETAILED DESCRIPTION OF THE INVENTION

MOS-type solid-state imaging apparatuses according to the embodiments of the present invention will be described below with reference to the accompanying drawings.

First Embodiment

Figure 3:
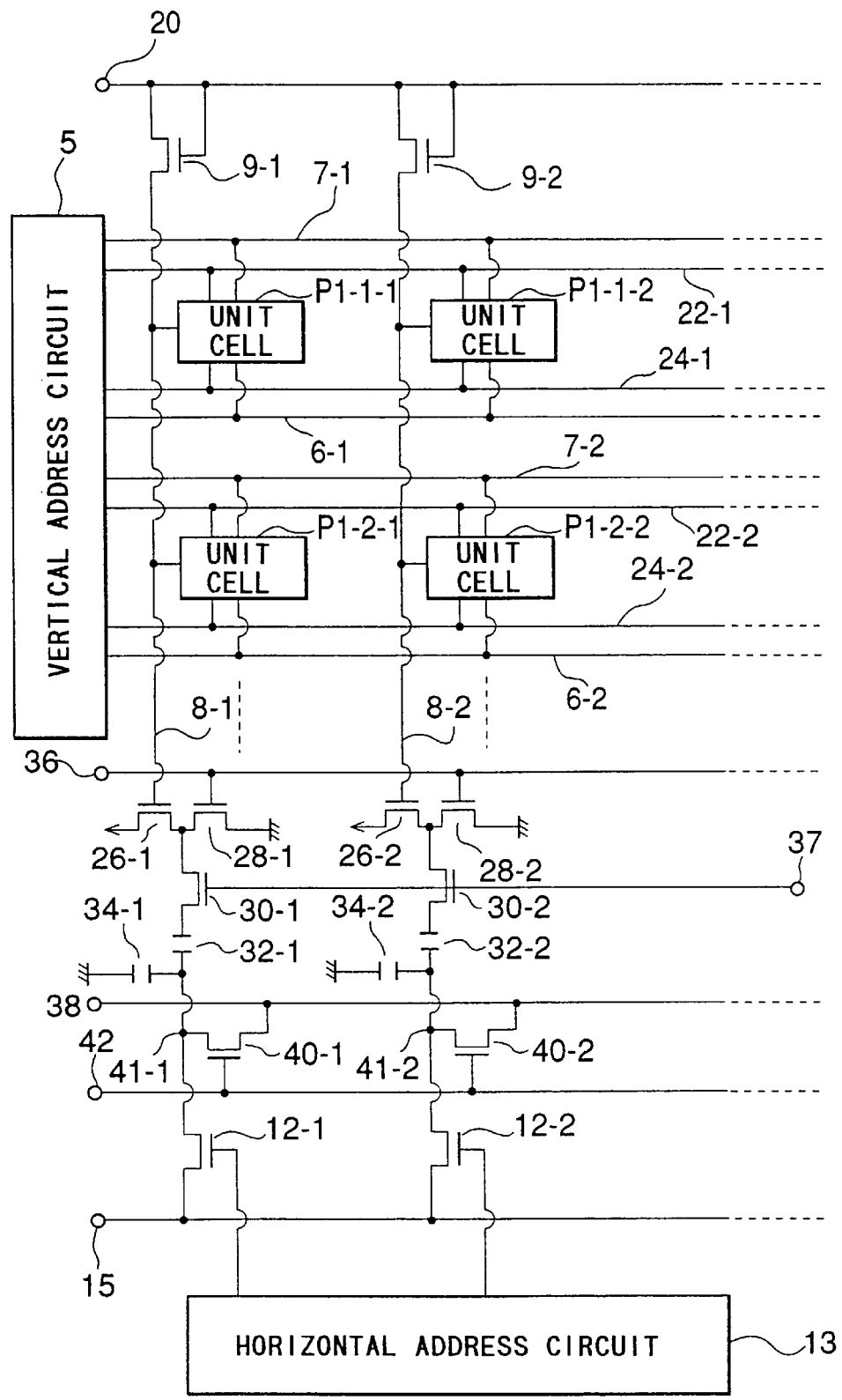
FIG. 3 is a circuit diagram showing the arrangement of an MOS-type solid-state imaging apparatus according to a first embodiment of the present invention.
Figure 7:
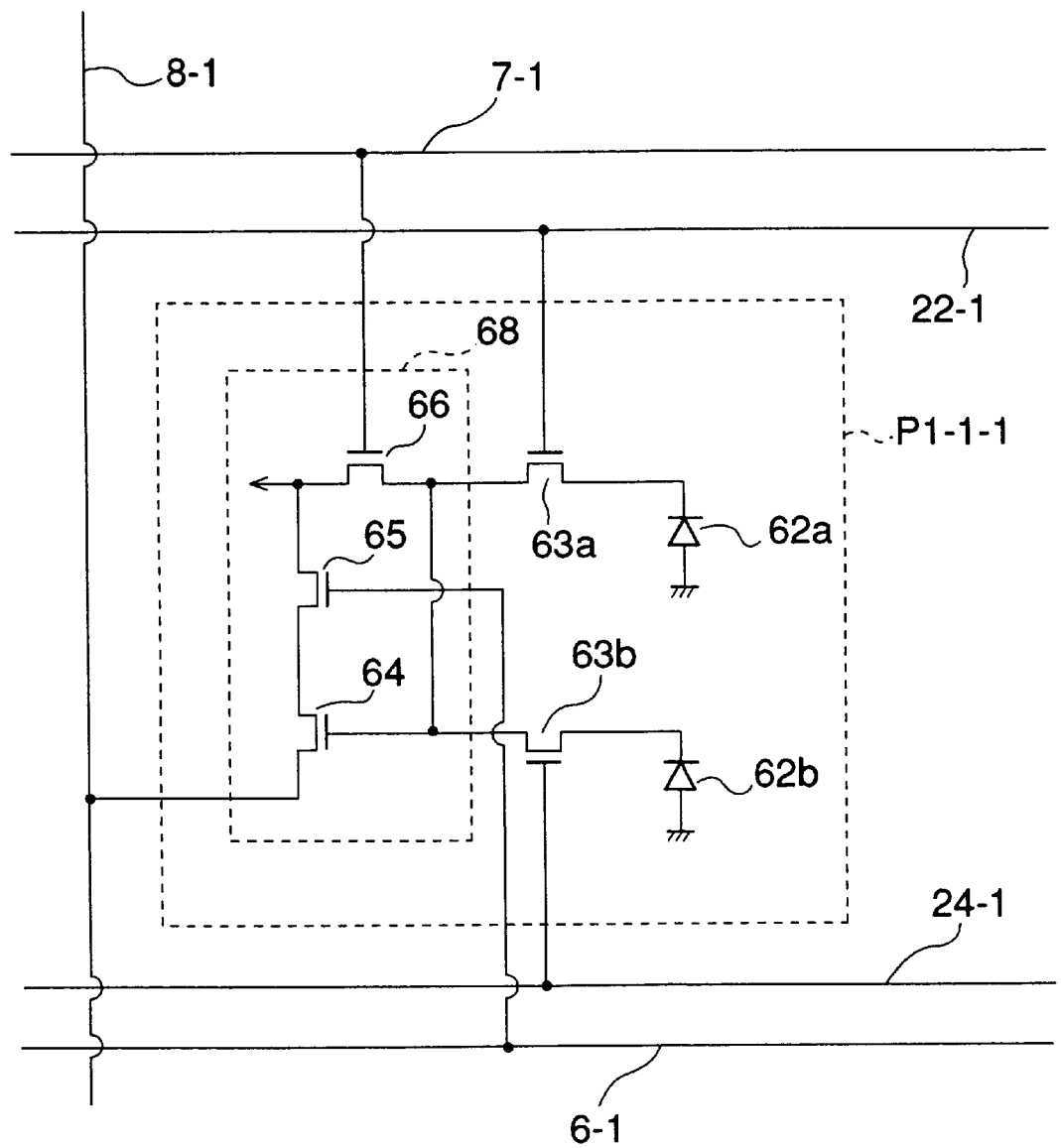
FIG. 7 a view showing still another circuit arrangement of the vertical address circuit in the first embodiment.
Figure 18:
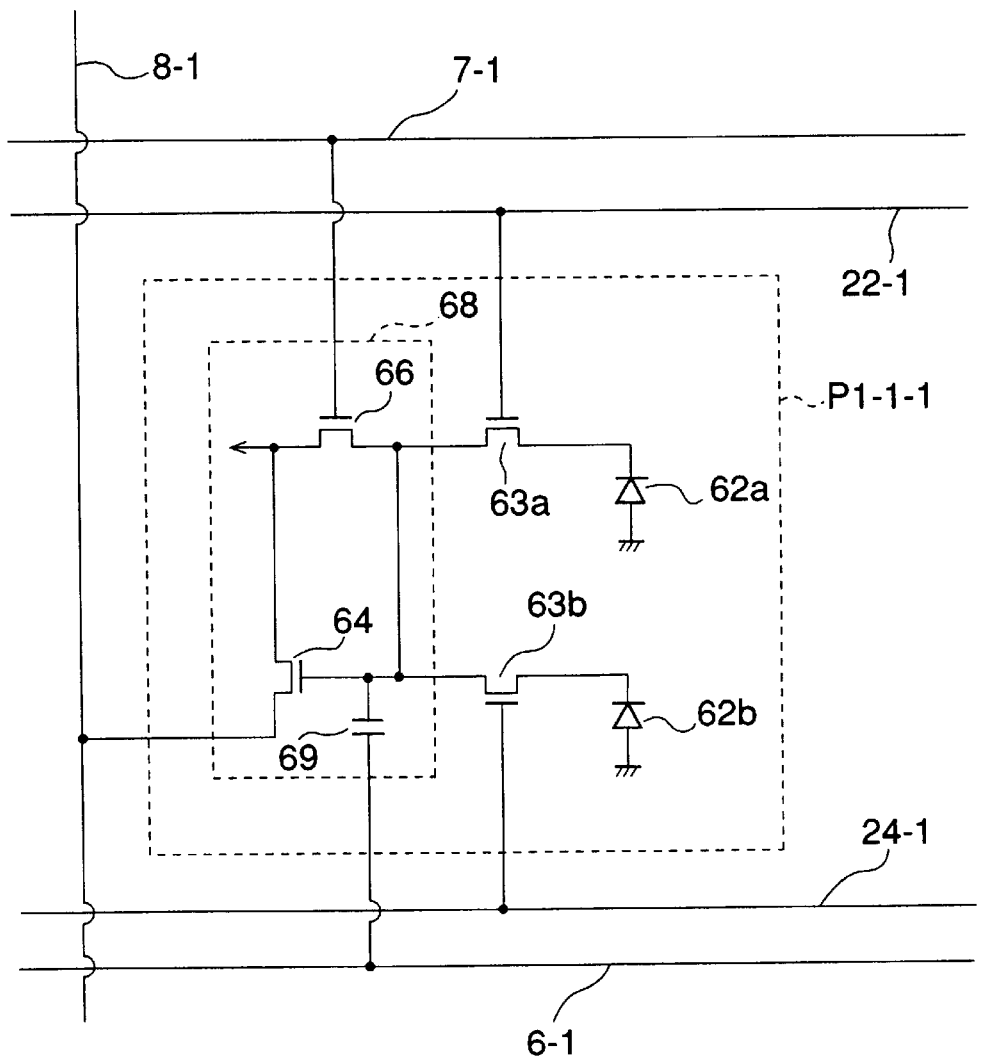
FIG. 18 is a view showing a modification of an output circuit of the unit cell in the first embodiment.

FIG. 3 shows the arrangement of an MOS-type solid-state imaging apparatus according to the first embodiment of the present invention. Unit cells P1-i-j are arranged in the form of a two-dimensional matrix. Although FIG. 3 shows only a 2×2 matrix, the actual apparatus has several thousand cells× several thousand cells. Reference symbol i denotes a variable in the horizontal (row) direction; and j, a variable in the vertical (column) direction. FIGS. 7 and 18 show the details of each unit cell P1-i-j.

The range of applications of the solid-state imaging apparatus of the present invention includes video cameras, electronic still cameras, digital cameras, facsimile apparatuses, copying machines, scanners, and the like.

Vertical address lines 6-1, 6-2, . . . horizontally wired from the vertical address circuit 5 are connected to the unit cells in the respective rows to determine horizontal lines for reading out signals. Similarly, reset lines 7-1, 7-2, . . . horizontally wired from the vertical address circuit 5 are connected to the unit cells in the respective rows. As will be described later, since each unit cell in this embodiment includes two photodiodes, first photodiode selection lines 22-1, 22-2, . . . and second photodiode selection lines 24-1, 24-2, . . . which extend horizontally from the vertical address circuit 5 and are connected to the unit cells in the respective rows.

The unit cells in the respective columns are connected to the vertical signal lines 8-1, 8-2, . . . arranged in the column direction. Each of the load transistors 9-1, 9-2, . . . is connected to one end of a corresponding one of the vertical signal lines 8-1, 8-2, . . . . The gates and drains of the load transistors 9-1, 9-2, . . . . are commonly connected to a drain voltage terminal 20.

The other end of each of the vertical signal lines 8-1, 8-2, . . . . is connected to the gate of a corresponding one of MOS transistors 26-1, 26-2, . . . . . The sources of the MOS transistors 26-1, 26-2, . . . are connected to the drains of MOS transistors 28-1, 28-2, . . . . The MOS transistors 26-1, 26-2, . . . and the MOS transistors 28-1, 28-2, . . . operate as source follower circuits. The gates of the MOS transistors 28-1, 28-2, . . . are connected to a common gate terminal 36.

Each of the connection points between the MOS transistors 26-1, 26-2, . . . and the MOS transistors 28-1, 28-2, . . . is connected to one end of a corresponding one of clamp capacitors 32-1, 32-2, . . . through a corresponding one of sample/hold transistors 30-1, 30-2, . . . . Each of sample/hold capacitors 34-1, 34-2, . . . and each of clamp transistors 40-1, 40-2, . . . are connected in parallel with the other end of a corresponding one of the clamp capacitors 32-1, 32-2, . . . . The other end of each of the sample/hold capacitors 34-1, 34-2, . . . is grounded. The other end of each of the clamp capacitors 32-1, 32-2, . . . is also connected to the signal output terminal (horizontal signal line) 15 through a corresponding one of horizontal selection transistors 12-1, 12-2, . . . .

Figure 4:
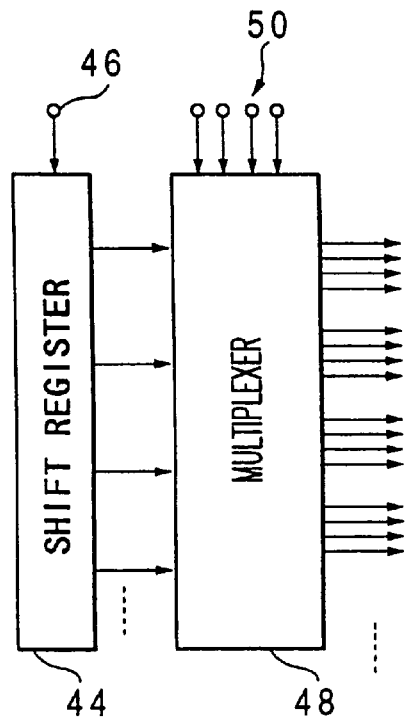
FIG. 4 is a view showing a circuit arrangement of a vertical address circuit in the first embodiment.
Figure 5:
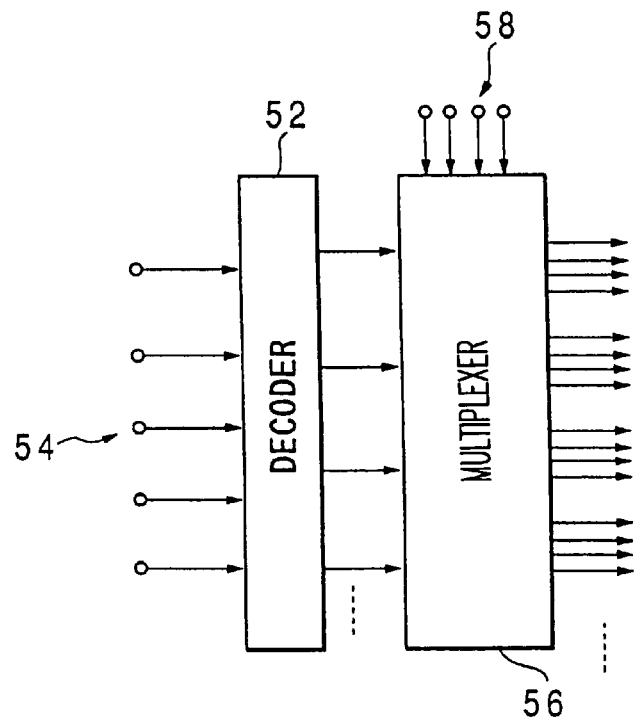
FIG. 5 is a view showing another circuit arrangement of the vertical address circuit in the first embodiment.
Figure 6:
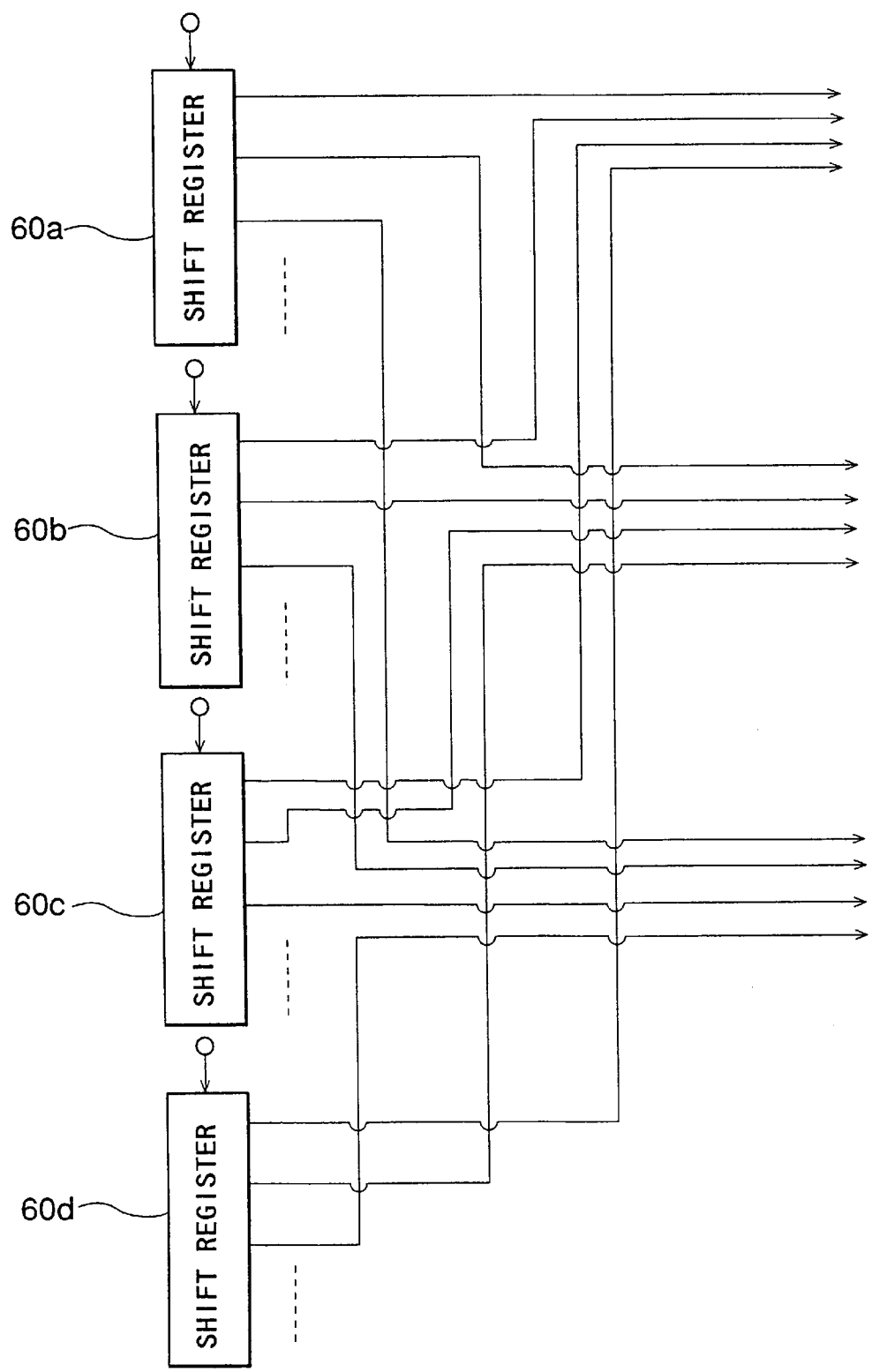
FIG. 6 a view showing still another circuit arrangement of the vertical address circuit in the first embodiment.

The vertical address circuit 5 is a circuit for shifting a plurality of signals, four signals in this case, together, and is realized by one of the circuits shown in FIGS. 4, 5, and 6. In the case shown in FIG. 4, outputs from many output terminals of a shift register 44 for sequentially shifting and outputting an input signal 46 are synthesized with a four-input signal 50 by a multiplexer 48. In the case shown in FIG. 5, outputs from a decoder 52 for decoding an encoded input 54 are synthesized with a four-input signal 58 by a multiplexer 56. In the case shown in FIG. 6, the outputs of four shift registers 60a, 60b, 60c, and 60d are bundled into control signal lines in the respective rows.

FIG. 7 shows an arrangement of a unit cell P1-1-1 in FIG. 3. Although FIG. 7 shows the arrangement of only the unit cell P1-1-1, the same arrangement is used for each of remaining unit cells P1-1-2, . . . .

As shown in FIG. 7, each unit cell of the MOS-type solid-state imaging apparatus of this embodiment includes two photodiodes 62a and 62b adjacent to each other in the vertical direction, two photodiode selection transistors 63a and 63b for selecting one of detection signals from the photodiodes 62a and 62b as an output from the unit cell, and an output circuit 68 for outputting the photodiode output signal selected by the photodiode selection transistors 63a and 63b from the unit cell. The selection switches 63a and 63b are ON/OFF-controlled independently. By turning on the respective selection switches 63a and 63b, the charges stored in the photodiodes 62a and 62b can be time-divisionally output to the output circuit 68.

The output circuit 68 is constituted by an amplification transistor 64 having a gate to which a charge signal from each photodiode is supplied and serving to amplify the signal, a vertical selection transistor 65 for selecting a unit cell from which a signal is to be read out, and a reset transistor 66 for charging/discharging the gate of the amplification transistor 64.

The vertical address line 6-1 horizontally wired from the vertical address circuit 5 is connected to the gate of the vertical selection transistor 65 to select a line for reading out a signal. Similarly, the reset line 7-1 and photodiode selection lines 22-1 and 24-1 horizontally wired from the vertical address circuit 5 are connected to the gate of the reset transistor 66 and the gates of the photodiode selection transistors 63a and 63b, respectively.

As described above, in each unit cell of the MOS-type solid-state imaging apparatus of this embodiment, unlike the prior art (one photodiode per unit cell), a plurality of photodiodes, two photodiodes adjacent to each other in the vertical direction in this case, share one output circuit 68. Each unit cell is therefore constituted by five transistors including two transistors for selecting a photodiode. That is, 2.5 transistors are necessary for one photodiode. For this reason, the area of each unit cell can be reduced as compared with the prior art shown in FIG. 1 which requires three transistors for one photodiode, thereby realizing a compact solid-state imaging apparatus.

Each unit cell of the MOS-type solid-state imaging apparatus of this embodiment is also characterized in that the two photodiodes 62a and 62b are connected to the output circuit 68 through the photodiode selection transistors 63a and 63b, i.e., the photodiodes 62a and 62b are connected in parallel with each other to the output circuit 68. A method of sharing one output circuit 68 among a plurality of photodiodes 62 is not limited to the above method. For example, a so-called series connection method is available. In this method, only one photodiode is connected to an output circuit, while the other photodiode is connected to the output circuit through the photodiode connected to the output circuit. In the series connection method, however, it is difficult to independently read out a detection signal from each of a plurality of photodiodes without destroying the detection signals stored in the remaining photodiodes.

In general, in the amplification-type MOS solid-state imaging apparatus, since variations in the threshold voltages of the amplification transistors 64 are superimposed on signals, even if the potentials of the photodiodes 62 are the same, the output signals vary. When a sensed image is reproduced, therefore, two-dimensional noise (called fixed pattern noise because the noise is fixed to a specific place) corresponding to the threshold variations of the amplification transistors 64 is caused. For this reason, in this embodiment, noise reduction circuits for suppressing this fixed pattern noise are arranged in place of the signal transfer transistors and the storage capacitances in FIG. 1. In FIG. 3, a correlation double sampling type circuit for obtaining the difference between a signal and a noise in a voltage domain is shown as a noise reduction circuit. The type of noise reduction circuit, however, is not limited to the correlation double sampling type, and various types of noise reduction circuits can be used.

Figure 8:
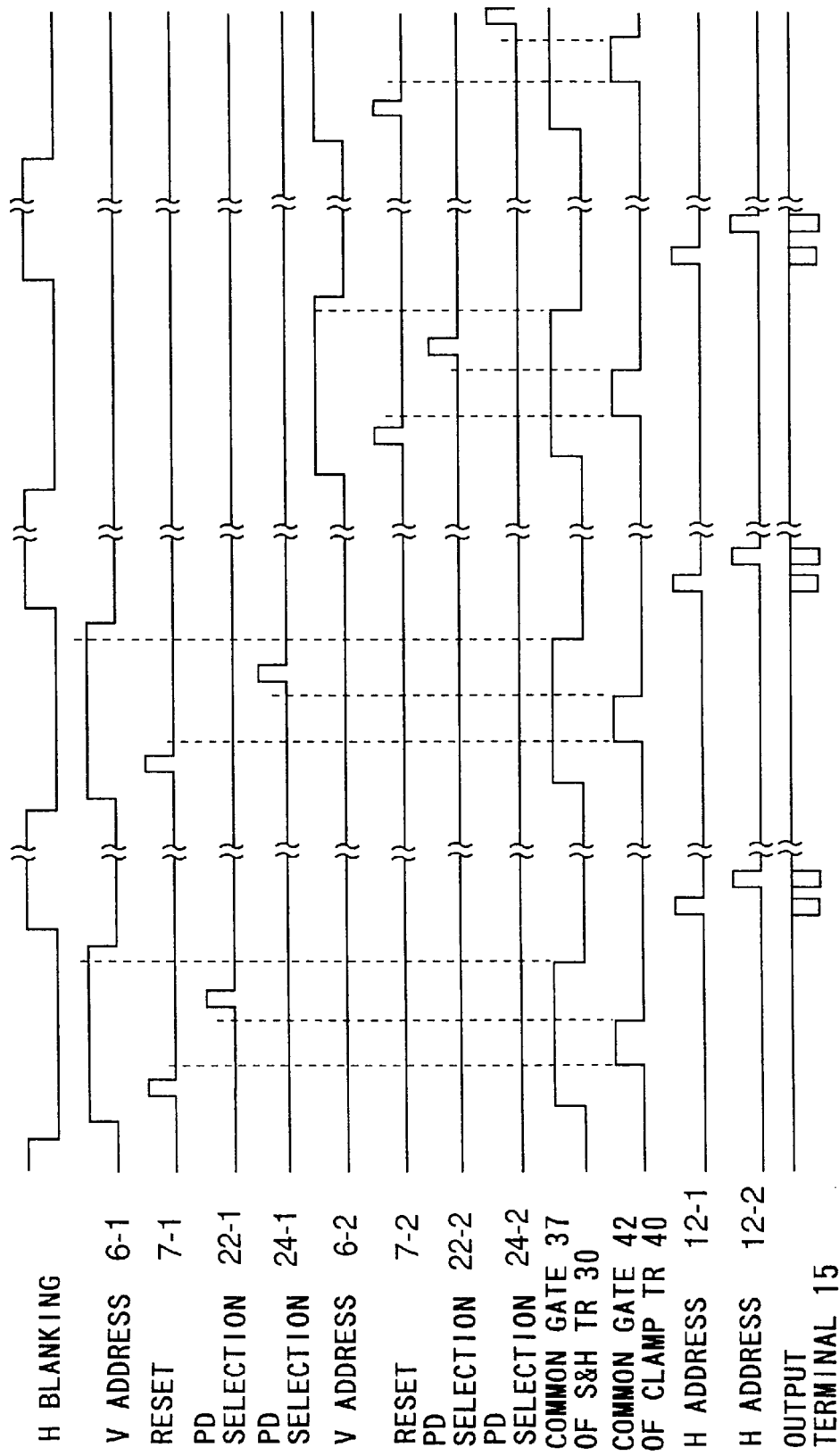
FIG. 8 is a timing chart showing the operation of the first embodiment.

The operation of the MOS-type solid-state imaging apparatus having the above arrangement will be described next with reference to the timing chart of FIG. 8. Since the common drain terminal 20 of the load transistors 9, the common gate terminal 36 of the transistors 28 of impedance converters, and the common source terminal 38 of the clamp transistors 40 are DC-driven, their operations are omitted from the timing chart.

When a high-level address pulse is applied to the vertical address line 6-1, the vertical selection transistors 65 of the unit cells P1-1-1, P1-1-2, . . . connected to the vertical address line 6-1 are turned on. As a result, source follower circuits are constituted by the amplification transistors 64 and the load transistors 9-1, 9-2, . . .

The common gate 37 of the sample/hold transistors 30-1, 30-2, . . . is set at high level to turn on the sample/hold transistors 30-1, 30-2, . . . Thereafter, the common gate 42 of the clamp transistors 40-1, 40-2, . . . is set at high level to turn on the clamp transistors 40-1, 40-2, . . .

When a high-level reset pulse is applied to the reset line 7-1, the reset transistors 66 of the unit cells P1-1-1, P1-1-2, . . . connected to the reset line 7-1 are turned on to reset the charges at the input terminals of the output circuits 68. With this operation, noise components corresponding to the threshold variations of the amplification transistors 64 in the absence of signal charges in the photodiodes 62 are output from the output circuits 68.

The common gate 42 of the clamp transistors 40-1, 40-2, . . . is set at low level to turn off the clamp transistors 40-1, 40-2, . . . With this operation, the noise components appearing on the vertical signal lines 8-1, 8-2, . . . are clamped in the clamp capacitors 32-1, 32-2, . . . As described above, the timing at which the potentials of the vertical signal lines 8-1, 8-2, . . . are clamped by the clamp capacitors 32-1, 32-2, . . . coincides with the timing at which the clamp pulse applied to the common gate 42 of the clamp transistors returns to low level, and comes between the reset pulse and the photodiode selection pulse.

In the unit cells P1-1-1, P1-1-2, . . . , signal charges are stored in the photodiodes 62a after a reset operation, and are to be read next. When a high-level selection pulse is applied to the photodiode selection line 22-1, output signals (signal charge components plus noise components) from the photodiodes 62a are output from the output circuits 68. As described above, since the noise components are stored in the clamp capacitors 32-1, 32-2, . . . , voltage changes on the vertical signal lines 8-1, 8-2, . . . , i.e., only the signal voltages without fixed pattern noise, obtained by subtracting the noise components from the signal components plus noise components, appear on the clamp nodes 41-1, 41-2, . . .

In this case, when only the noise components are read out first, and the signal components plus noise components are then read out, random noise caused by the reset operation can be reduced at the same time.

Subsequently, the common gate 37 of the sample/hold transistors 30-1, 30-2, . . . is set at low level to turn off the sample/hold transistors 30-1, 30-2, . . . With this operation, the voltages without noise, appearing on the clamp nodes 41-1, 41-2, . . . are stored in the sample/hold capacitors 34-1, 34-2, . . .

By sequentially applying horizontal address pulses to the horizontal selection transistors 12-1, 12-2, . . . afterward, the signals without noise, which are supplied from the photodiodes 62a and stored in the sample/hold capacitors 34-1, 34-2, . . . , are read out from the output terminal (horizontal signal line) 15.

When a high-level address pulse is to be applied to the vertical address line 6-1 next, a high-level selection pulse is applied to the photodiode selection line 24-1 in place of the photodiode selection line 22-1 to cause the output circuits 68 to output the output signals from the photodiodes 62b. Other operations are the same as those described above.

By repeating the above operation for the vertical address lines 6-2, 6-3, . . . in the same manner as described above, the signals in all the cells arranged two-dimensionally can be output.

When each output circuit is to be operated only once in one frame interval as in the prior art, all detection signals from a plurality of photodiodes connected to the output circuit cannot be read out within one frame interval.

In contrast to this, according to the method of driving the MOS-type solid-state imaging apparatus of this embodiment, the vertical selection transistor 65 is turned on once in each of two consecutive horizontal blanking intervals in one frame interval so as to operate the output circuit 68. With this operation, a detection signal from the photodiode 62a is read out first, and a detection signal from the photodiode 62*b* is read out second. The MOS-type solid-state imaging apparatus having the micropatterned unit cells can therefore be driven.

As described above, detection signals from all the photodiodes cannot be read out unless each output circuit is operated twice or more in one frame interval. In addition, after a signal is read out from a given output circuit, this signal is superimposed on the next signal read out from the output circuit unless the output circuit is reset before the next signal is read out.

The MOS-type solid-state imaging apparatus of this embodiment is characterized in that the reset transistor 66 for charging/discharging is connected to the gate of the amplification transistor 64, and the potential of each photodiode is reset through a photodiode selection transistor 63. In this arrangement, the number of transistors per unit cell can be reduced as compared with the arrangement in which the amplification transistors 64 are respectively connected to the photodiodes 62*a* and 62*b*.

In addition, this embodiment is characterized in that two photodiodes adjacent to each other in the vertical direction share an output circuit. With this arrangement, charge signals are read out once in one horizontal blanking interval by using the amplification transistor 64, thus facilitating driving of the amplification transistor 64. That is, the embodiment is characterized in that the read direction differs from the sharing direction.

A sequence in the timing chart of FIG. 8 will be described below. The following three sequences are required:

(1) Rise of vertical address pulse→Fall of reset pulse→Fall of clamp pulse→Rise of photodiode selection pulse→Fall of photodiode selection pulse→Fall of sample/hold pulse→Fall of vertical address (2) Rise of sample/hold pulse→Rise of photodiode selection pulse (3) Rise of clamp pulse→Rise of photodiode selection pulse Although the order of the rise of the vertical address pulse, the rise of the sample/hold pulse, the rise of the clamp pulse, and the rise of the reset pulse can be arbitrarily set, the following order is preferable.

Rise of vertical address→Rise of sample/hold pulse→Rise of clamp pulse→Rise of reset pulse As described above, according to the operation in FIG. 8, since a voltage corresponding to the difference between the voltage set when no signal is present after a reset operation and the voltage set when a signal (plus noise) is present, appears on the clamp node 41, fixed pattern noise caused by threshold variations of the amplification transistors 64 is compensated. That is, a circuit constituted by the clamp transistor 30, the clamp capacitor 31, the sample/hold transistor 40, and the sample/hold capacitor 34 serves as a noise canceler.

Note that the noise canceler in this embodiment is connected to the vertical signal line 8 through the impedance converters 26 and 28 constituted by source follower circuits. That is, the vertical signal line 8 is connected to the gate of the transistor 26. Since this gate capacitance is very small, the amplification transistors 64 of the unit cells charge only the vertical signal lines 8-1, 8-2, . . . . For this reason, the time constant of each CR is small, and a steady state is quickly set. The application timings of a reset pulse and a photodiode selection pulse can therefore be quickened to perform a noise canceling operation within a short period of time. When a television signal is to be handled, a noise canceling operation must be performed in a horizontal blanking interval. The ability to perform accurate noise cancellation within a short period of time is a great advantage. In addition, since the impedance of the noise canceler apparently remains the same, as viewed from the unit cell, in a signal pulse noise output operation and in a noise output operation included in a noise canceling operation, noise can be accurately canceled.

The structure of this embodiment will be described next.

As is apparent from the circuit arrangement in FIG. 3, since the clamp capacitor 32 and the sample/hold capacitor 34 are directly connected to each other and located near each other, these components may be stacked on the same surface, attaining a reduction in unit cell size.

Figure 9:
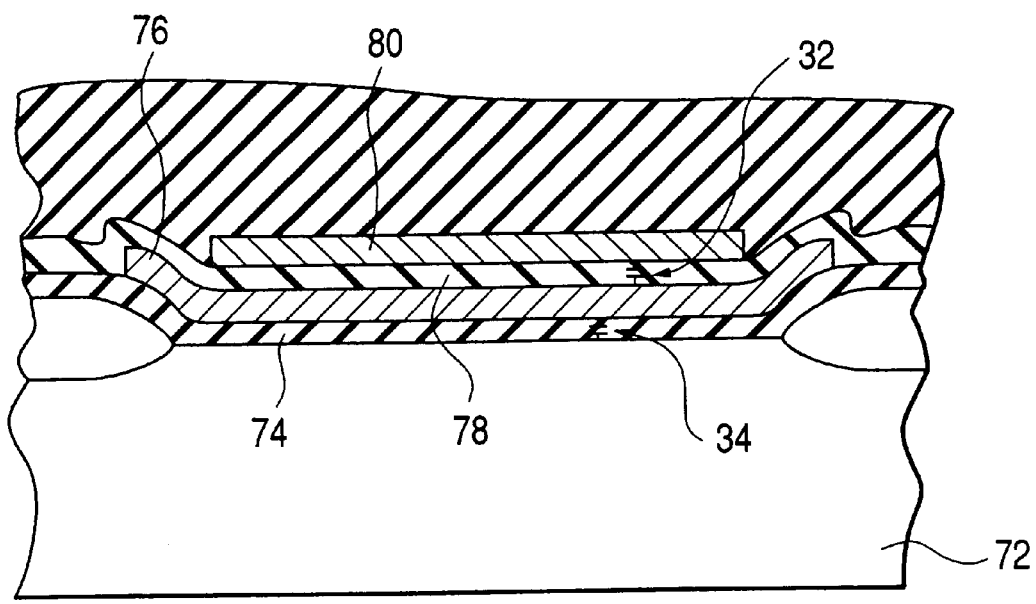
FIG. 9 is a sectional view showing the device structure of a noise canceler in the first embodiment.

More specifically, as shown in FIG. 9, a first electrode 76 is formed on a silicon substrate 72 through a first insulating film 74 to form the sample/hold capacitor 34. In addition, a second electrode 80 is formed on the first electrode 76 through a second insulating film 78 to form the clamp capacitor 32.

As is also apparent from FIG. 9, since the first electrode 76 serves as a common electrode, and the clamp capacitor 32 and the sample/hold capacitor 34 are stacked on each other, the same capacitance value as that obtained when these components are separately formed can be obtained with ½ the area.

In this embodiment, unit cells P1-1-1, P1-1-2, . . . and peripheral circuits such as the vertical address circuit 5 and the horizontal address circuit 13 are formed on a semiconductor substrate having a $p^+$-type impurity layer formed on a $p^-$-type substrate.

Figures 10A, 10B:
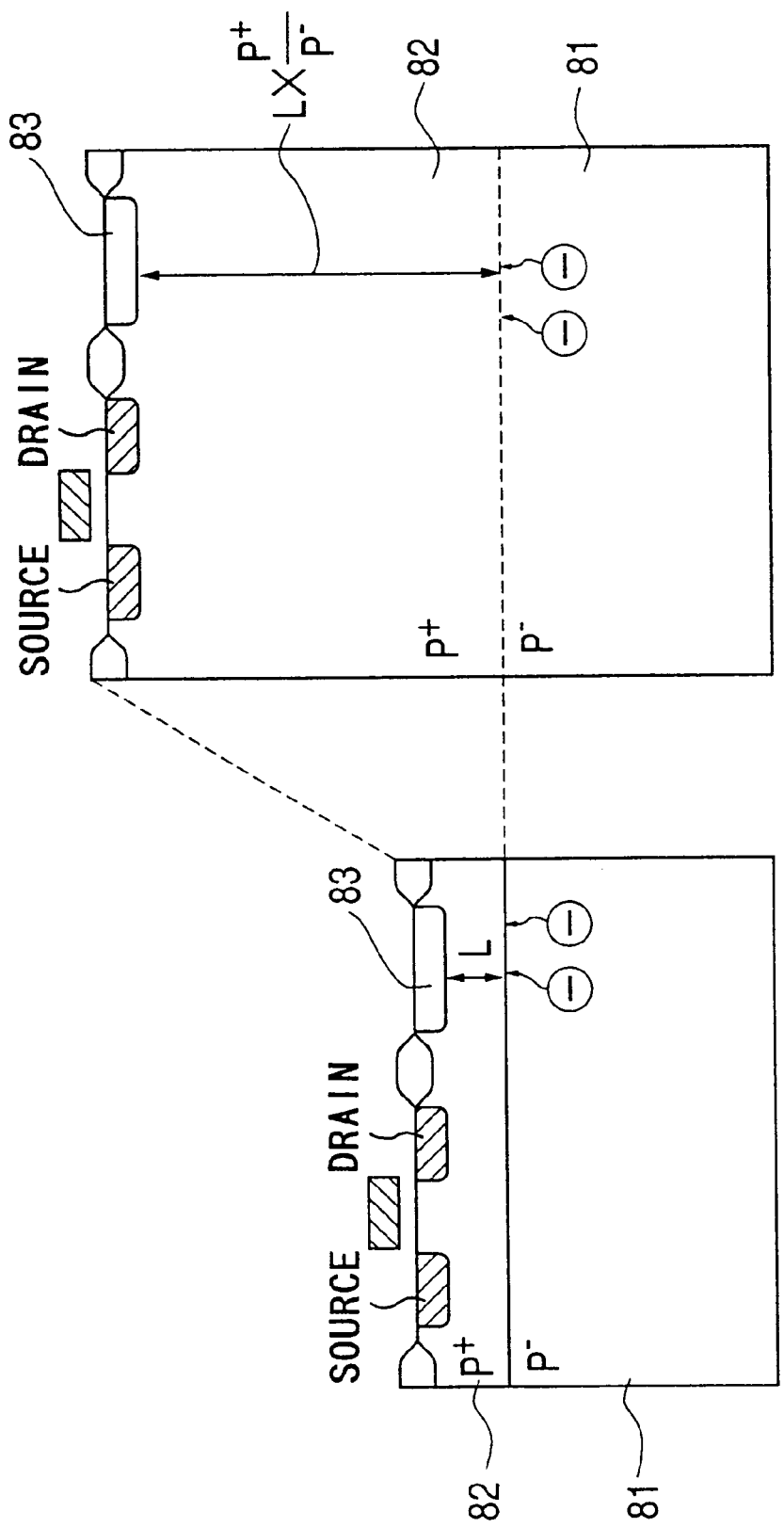
FIGS. 10A and 10B are sectional views showing the device structure of a unit cell in the first embodiment.

FIGS. 10A and 10B are sectional views showing such a semiconductor substrate.

As shown in FIG. 10A, cell elements such as photodiodes 83 are formed on a semiconductor substrate having a $p^+$-type impurity layer 82 formed on a $p^-$-type substrate 81.

With this structure of the semiconductor substrate, the diffusion potential at the $p^-/p^+$ boundary can partly prevent a dark current generated in the $p^-$-type substrate 81 from flowing to the $p^+$ layer side.

The result of a detailed analysis of the flows of electrons will be briefly described below. Apparently, a thickness L of the $p^+$-type impurity layer 82 is increased by $p^+/p^-$ concentration ratio times, i.e., to $L \cdot p^+/p^-$, from the viewpoint of an electron generated on the $p^-$ side.

As shown in FIG. 10B, apparently, the distance from the $p^-$-type substrate 81 as a dark current source to the photodiode 83 is increased $p^+/p^-$ times. In addition to the dark current flowing from a deep part of the substrate, a dark current is generated in a depletion layer near the photodiode 83. This dark current generated in the depletion layer is almost equal in magnitude to the dark current flowing from the deep part of the substrate. The thickness of the depletion layer is about 1 μm, and the dark current flowing from the deep part of the substrate also flows from a depth of about 100 μm. This depth is called the diffusion length of an electron in a substrate. The reason why these dark currents are almost equal in magnitude regardless of this thickness difference is that the probability of occurrence of a dark current per unit volume is higher in the depletion layer. In this case, since the dark current generated in the depletion layer cannot be theoretically separated from a signal current, the dark current is reduced by reducing a component flowing from the deep part of the substrate.

In addition, since cells are formed on the semiconductor substrate having the $p^+$-type impurity layer 72 formed on the $p^-$-type substrate 71, variations in substrate potential due to the dark current can be prevented. The p-type substrate is thick and hence has a high resistance. As will be described later, a noise reduction circuit can be reliably operated.

When the element temperature rises, the component from the deep part of the substrate abruptly increases. This is therefore important. It suffices if the component from the deep part of the substrate is sufficiently smaller than the component generated in the depletion layer. More specifically, it suffices if the dark current from the deep part of the substrate is about $1/10$ or less of the dark current from the depletion layer. That is, $p^+/p^-$ may be set to 10 to set the component from the deep part of the substrate to about $1/10$.

In a semiconductor substrate constituted by an n-type substrate and a p-type well, there is almost no dark current from a deep part of the substrate. To set the dark current to the same level as in such a semiconductor substrate, $p^+/p^-$ must be set to 100 to set the dark current from the deep part of the substrate to about $1/100$.

In a conventional practical CCD, the impurity concentration of an n-type buried channel is about $10^{16}$ cm$^{-3}$, and the impurity concentration of a p-type layer (p-type substrate in this case) surrounding the buried channel, which is set to stably manufacture the diffusion layer of the buried channel, is about $10^{15}$ cm$^{-3}$.

When $p^+/p^-$ is set to 10, the impurity concentration of the $p^+$-type layer becomes about $10^{16}$ cm$^{-3}$. When $p^+/p^-$ is set to 100, the impurity concentration of the $p^+$-type layer becomes about $10^{17}$ cm$^{-3}$. That is, the impurity concentration of the $p^+$-type layer becomes almost equal to that of the n-type buried channel, i.e., about $10^{16}$ cm$^{-3}$, or becomes higher than that by one order in magnitude.

For this reason, in a conventional practical CCD, the use of a $p^+$-type layer having such an impurity concentration has not been considered. If the impurity concentration of the $p^-$-type layer is decreased, the sheet resistance of the substrate undesirably increases.

In contrast to this, in an amplification-type MOS imaging apparatus, since the buried channel of a CCD is not formed, the value of $p^+/p^-$ can be arbitrarily set to a certain degree without decreasing the impurity concentration of the $p^-$-type layer.

Cells can also be formed by improving the structure of a semiconductor substrate constituted by an n-type substrate and a p-type well by decreasing the resistance of the p-type well.

Figure 11:
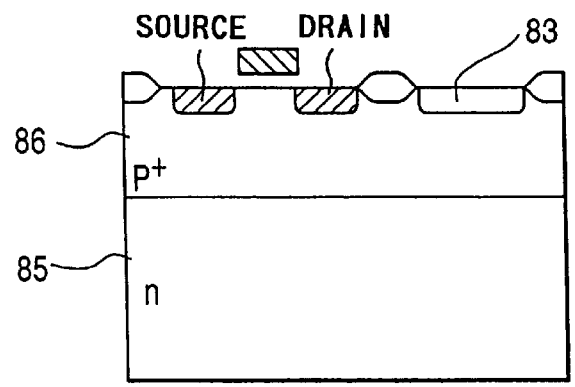
FIG. 11 is a view showing a modification of the semiconductor substrate of a portion of a unit cell in the first embodiment.
Figure 12:
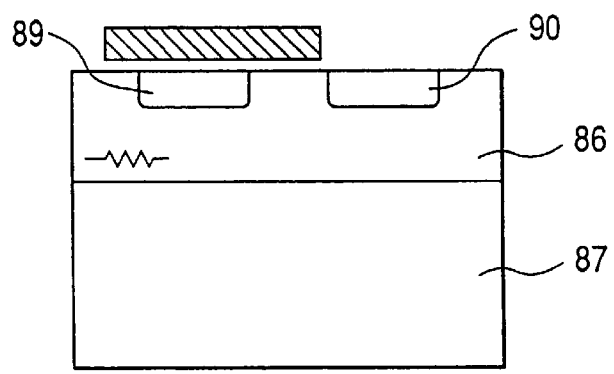
FIG. 12 is a sectional view showing a conventional cell of a CCD-type solid-state imaging apparatus.

FIG. 11 is a sectional view showing a unit cell using a $p^+$-type well 86 having a low sheet resistance on an n-type substrate 85. FIG. 12 is. a sectional view showing a unit cell of a CCD.

To stably manufacture a CCD, the impurity concentrations of an n-type substrate 87, a p-type well 86, and an n-type buried channel 89 of the unit cell are respectively set to about $10^{14}$ cm$^{-3}$, about $10^{15}$ cm$^{-3}$, and about $10^{16}$ cm$^{-3}$.

Since the impurity concentration of an n-type photodiode 90 can be arbitrarily set to a certain degree, not many limitations are imposed in terms of manufacture. With the above impurity concentrations, the sheet resistance of the $p^+$-type well 86 is about 100 k $\Omega/\square$. As described above, with such a large value, the noise caused in the CCD is very small.

When a noise reduction circuit is to be used in an amplification-type MOS imaging apparatus, the sheet resistance of the p-type well is very important. This is because, the time taken to suppress disturbances in the potential of the p-type well 86 due to a reset pulse needs to match a system to which this apparatus is to be applied.

According to the NTSC scheme, which is the existing television scheme, the noise reduction circuit is operated in an interval of about 11 [μs], which is a horizontal blanking interval. Disturbances in the potential of the p-type well 86 must be suppressed to about 0.1 [mV] within this interval.

Such a small value as 0.1 [mV] is set because the noise voltage output of the CCD corresponds to this. According to a detailed analysis, to settle the disturbances to a value as small as 0.1 [mV] within the very short time interval of 11 [μs], the sheet resistance of the $p^+$-type well 86 must be set to 1 k $\Omega/\square$ or less. This is about $1/100$ the sheet resistance of the conventional CCD.

For this purpose, the impurity concentration of the $p^+$-type well 86 must be increased to about 100 times. Such a concentration cannot be set in the CCD, as described above with reference to the p-type substrate. Furthermore, in the high-vision television scheme, the horizontal blanking interval is 3.77 [μs], and hence the sheet resistance of the $p^+$-type well 86 must be set to 300 k $\Omega/\square$ or less.

As another modification, a semiconductor substrate may be obtained by forming a heavily doped $p^+$-type sandwich layer on a substrate, and forming a lightly doped p-type layer on the surface of the sandwich layer.

Figure 13:
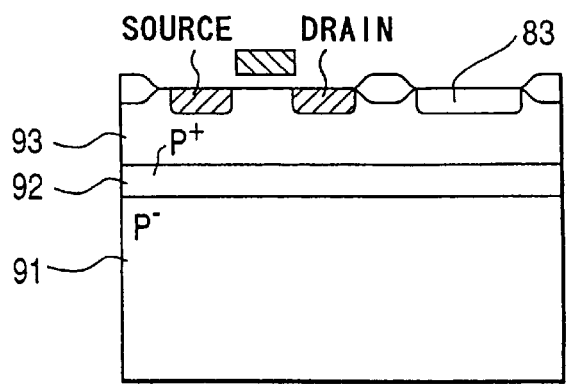
FIG. 13 is a view showing another modification of the semiconductor substrate of the portion of the unit cell in the first embodiment.
Figure 14:
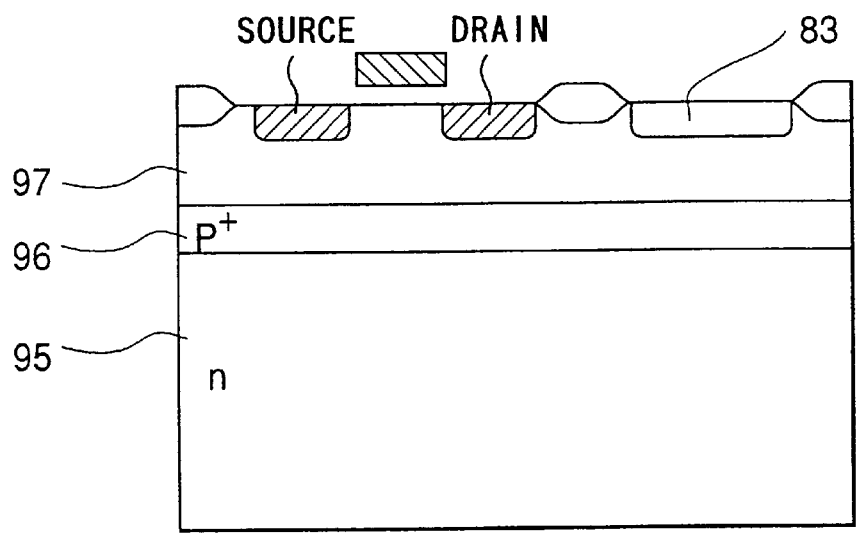
FIG. 14 is a view showing still another modification of the semiconductor substrate of the portion of the unit cell in the first embodiment.

FIG. 13 shows the structure of a semiconductor substrate having a $p^+$-type sandwich layer 92 formed between a $p^-$-type substrate 91 and a p-type layer 93. FIG. 14 shows a semiconductor substrate having a $p^+$-type sandwich layer 96 formed between an n-type substrate 95 and a p-type layer 97.

Such a $p^+$-type sandwich layer can be formed by a high-acceleration megavolt ion implantation apparatus.

In addition to photodiodes 83, transistors, and the like as the constituent elements of unit cells, peripheral circuits such as a horizontal address circuit and a vertical address circuit are also formed on the above p-type layer.

Figure 15:
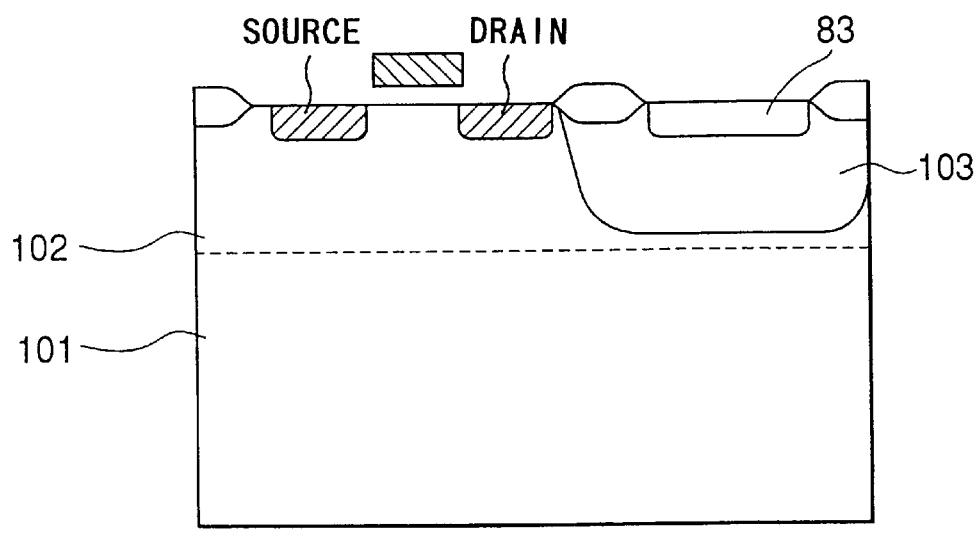
FIG. 15 is a view showing still another modification of the semiconductor substrate of the portion of the unit cell in the first embodiment.

FIG. 15 shows the structure of a semiconductor substrate obtained by surrounding a photodiode 83 with a heavily doped p-type well 103 and forming other portions on an n-type substrate 101 using another p-type well 102.

The use of this structure can prevent a dark current from leaking into the photodiode 83. Note that the semiconductor substrate 101 may be a $p^-$-type substrate.

The impurity concentration of the p-type well, which forms some or all of the horizontal and vertical address circuits around the cell, is determined in terms of circuit design, and differs from the optimum value of the cell. For this reason, a p-type layer may be formed independently of the p-type well which forms the imaging region.

Figure 16:
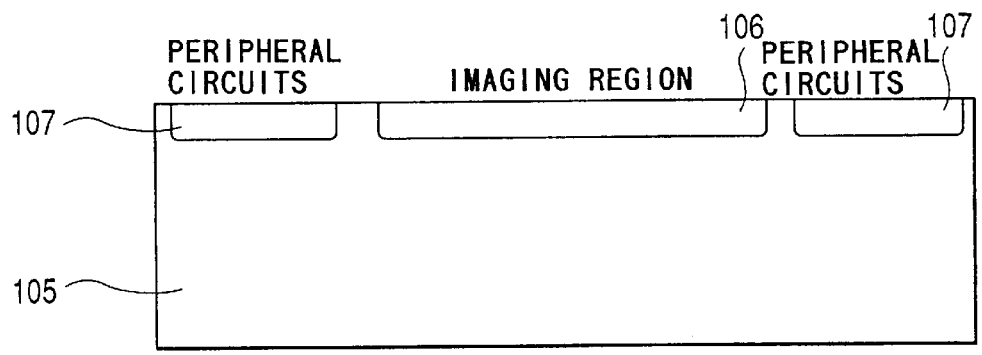
FIG. 16 is a view showing still another modification of the semiconductor substrate of the portion of the unit cell in the first embodiment.

FIG. 16 shows the structure of a semiconductor substrate obtained by forming a p-type well 106, which forms an imaging region, on an n-type substrate 105, and separately forming another p-type well 107, which forms peripheral circuits.

With this structure, p-type wells suited for the respective constituent elements can be formed. Note that the n-type substrate 105 may be a $p^-$-type substrate.

Figure 17:
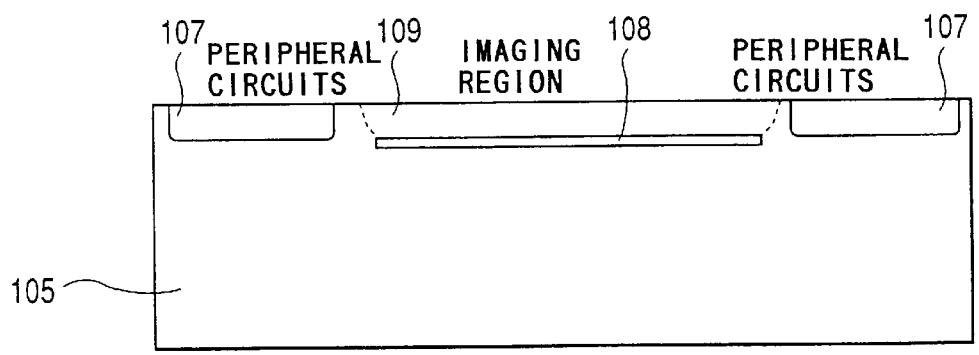
FIG. 17 is a view showing still another modification of the semiconductor substrate of the portion of the unit cell in the first embodiment.

FIG. 17 shows a structure in which a $p^+$-type sandwich layer 108, which forms an imaging region, and a lightly doped p-type layer 109 are formed on an n-type substrate 105, and another p-type well 107 is formed on a peripheral circuit portion.

With this structure, p-type wells suited for the respective constituent elements can be formed, and leakage of a dark current into the photodiode can be prevented. Note that the n-type substrate 105 may be a $p^-$-type substrate.

As described above, since this embodiment uses a unit cell in which one output circuit is shared between a plurality of (two in this case) photodiodes adjacent to each other in the vertical direction, the area of each unit cell can be reduced. The number of photodiodes sharing an output circuit is not limited to two, and may be three or more.

As shown in FIG. 18, the output circuit 68 may be modified such that a vertical selection capacitor 69 is arranged in place of the reset transistor 65. According to this arrangement, the number of transistors per unit cell can be further reduced, and hence the cell size can be effectively reduced. When a high-level is applied to the vertical address line 6-1, the gate voltage of the amplification transistor 64 shifts to a higher voltage. Since the gate voltages of the amplification transistors 64 of the adjacent unit cells are kept low, a signal from the addressed amplification transistor 64 appears on the vertical signal line 8-1.

Since an output from each unit cell is output through the noise canceler, fixed pattern noise corresponding to the threshold variations of the amplification transistor of the unit cell can be reduced. In addition, in the noise cancelers, since the clamp capacitors 32-1, 32-2, . . . (to be generically referred to as clamp capacitors 32 hereinafter; this applies to the other members denoted by reference numerals with suffixes) and the sample/hold capacitors 34 are directly connected to each other and located near, these members can be stacked on the same surface, thereby reducing the capacitors.

In addition, since an output from each unit cell is supplied to the noise canceler through the gate capacitor of the slice transistor, the impedance of the noise canceler remains almost the same, as viewed from the unit cell, in a noise output operation and a signal pulse noise output operation. For this reason, in both the output operations, the noise components are almost the same. When the difference between the noise output and the signal pulse noise output is obtained, the noise component can be accurately reduced, and only the signal component can be output, thereby accurately canceling the noise. Furthermore, when the noise canceler viewed from the unit cell, only the gate capacitance can be seen in terms of impedance. Since this capacitance is very small, the noise can be reliably canceled within a short period of time.

Furthermore, as a semiconductor substrate on which unit cells are formed, a substrate constituted by a p⁻-type impurity substrate and a p⁺-type impurity layer formed thereon is used to reduce a dark current flowing into each unit cell. In addition, since the potential at the substrate surface can be stabilized, the noise reduction circuit can be reliably operated.

An embodiment in which the noise canceler circuit portion of the first embodiment is modified will be described next.

Second Embodiment

Figure 19:
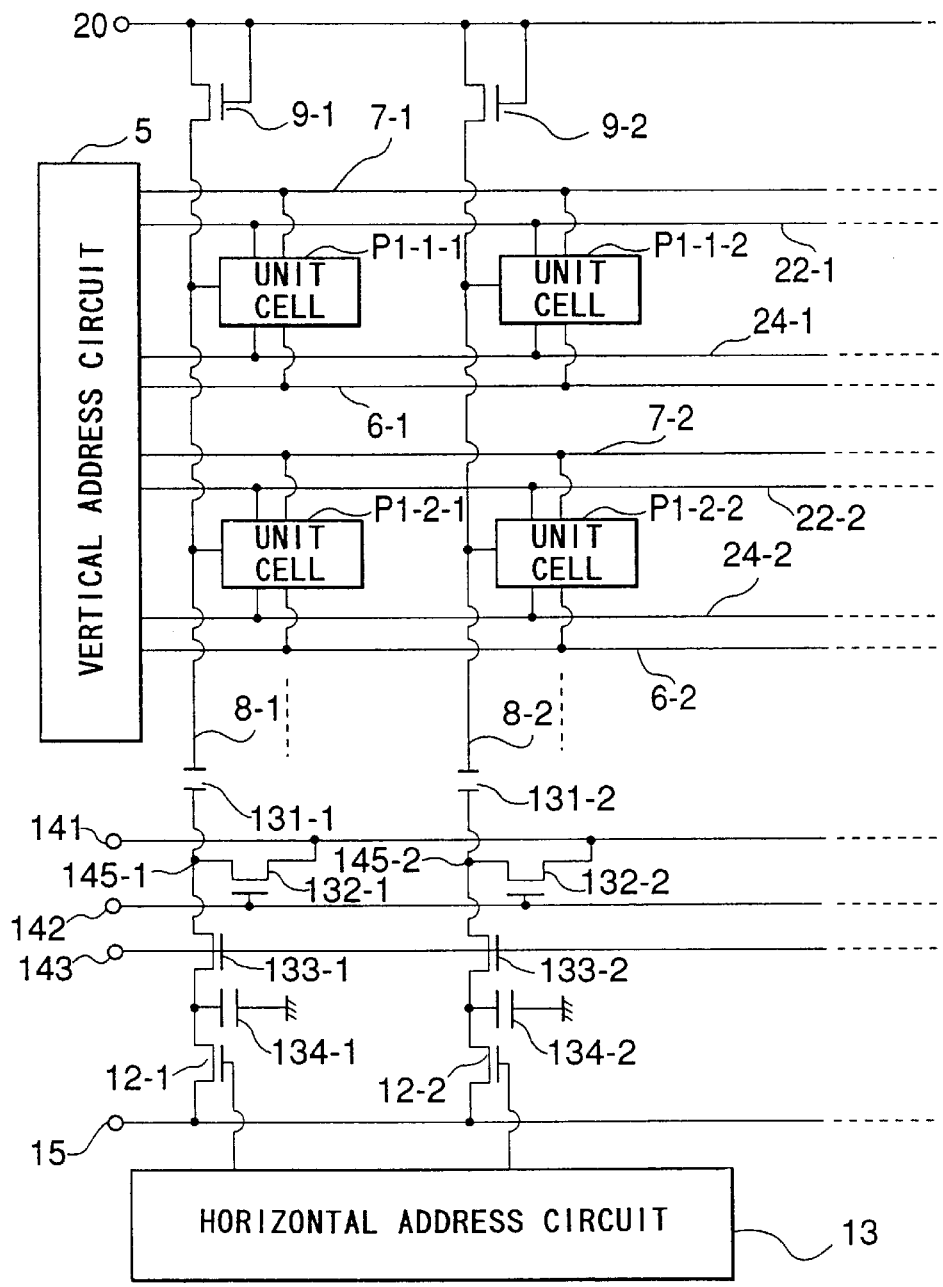
FIG. 19 is a circuit diagram showing the arrangement of an MOS-type solid-state imaging apparatus according to a second embodiment of the present invention.

FIG. 19 is a circuit diagram showing an imaging apparatus using an amplification-type MOS sensor according to the second embodiment of the present invention. The circuit structure of each unit cell P1-i-j is the same as that in the first embodiment.

The other end of each of vertical signal lines 8-1, 8-2, . . . is connected to the signal output terminal (horizontal signal line) 15 through a corresponding one of clamp capacitors 131-1, 131-2, . . . , a corresponding one of clamp transistors 132-1, 132-2, . . . , and a corresponding one of horizontal selection transistors 12-1, 12-2, . . . . The drains of the clamp transistors 132-1, 132-2, . . . are connected between the clamp capacitors 131-1, 131-2, . . . and sample/hold transistors 133-1, 133-2, . . . . The sources of the clamp transistors 132-1, 132-2, . . . are connected to a common source terminal 141. The gates of the clamp transistors 132-1, 132-2, . . . are connected to a common gate terminal 142. The connection points between the sample/hold transistors 133-1, 133-2, . . . and the horizontal selection transistors 12-1, 12-2, . . . are grounded through sample/hold capacitors 134-1, 134-2, . . . .

Figure 20:
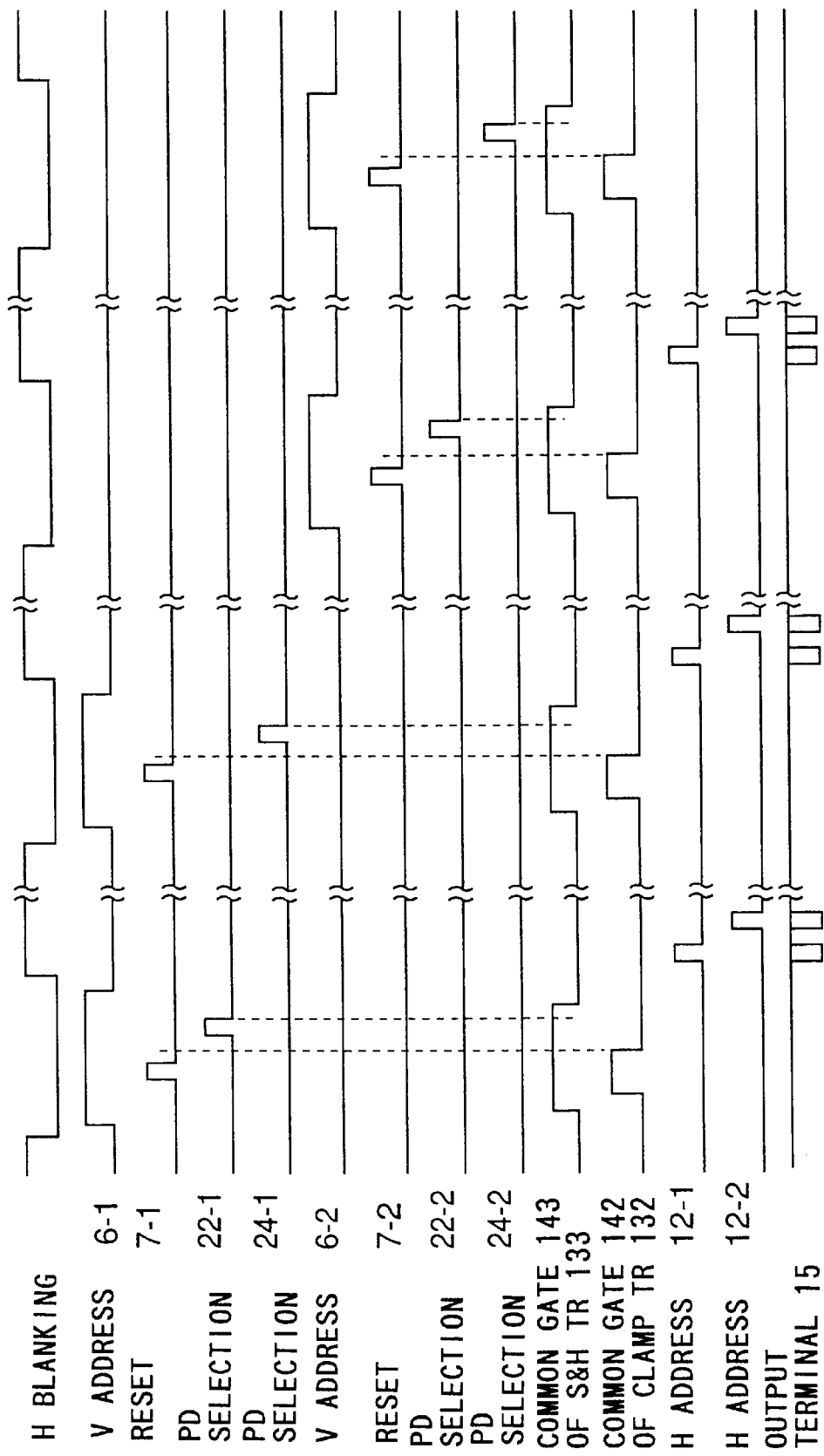
FIG. 20 is a timing chart showing the operation of the second embodiment.

The operation of the MOS-type solid-state imaging apparatus having the above arrangement will be described next with reference to the timing chart of FIG. 20. Since the common drain voltage terminal 20 of the load transistors 9 and the common source terminal 141 of the clamp transistors 132 are DC-driven, their operations are omitted from the timing chart. As each unit cell, the one shown in FIG. 7 will be described.

When a high-level address pulse is applied to the vertical address line 6-1, the vertical selection transistors 65 of the unit cells P1-1-1, P1-1-2, . . . connected to the vertical address line 6-1 are turned on. As a result, the source follower circuits are constituted by the amplification transistors 64 and the load transistors 9-1, 9-2, . . . .

The common gate 143 of the sample/hold transistors 133-1, 133-2, . . . is set at high level to turn on the sample/hold transistors 133-1, 133-2, . . . . Thereafter, the common gate terminal 142 of the clamp transistors 132-1, 132-2, . . . is set at high level to turn on the clamp transistors 132-1, 132-2, . . . .

When a high-level reset pulse is applied to the reset line 7-1, the reset transistors 66 of the unit cells P1-1-1, P1-1-2, . . . connected to the reset line 7-1 are turned on to reset the charges at the input terminals of the output circuits 68. As a result, noise components corresponding to the threshold variations of the amplification transistors 64 in the absence of signal charges in photodiodes 62 are output from the output circuits 68.

Subsequently, the common gate terminal 142 of the clamp transistors 132-1, 132-2, . . . is set at low level to turn off the clamp transistors 132-1, 132-2, . . . . With this operation, the noise components appearing on the vertical signal lines 8-1, 8-2, . . . are stored in the clamp capacitors 131-1, 131-2 . . . . As described above, the timing at which the potentials of the vertical signal lines 8-1, 8-2, . . . are clamped by the clamp capacitors 131-1, 131-2, . . . coincides with the timing at which the clamp pulse applied to the common gate 142 of the clamp transistors returns to low level, and comes between the reset pulse and the photodiode selection pulse.

In the unit cells P1-1-1, P1-1-2, . . . , signal charges are stored in the photodiodes 62a after a reset operation, and are to be read next. When a high-level selection pulse is applied to the photodiode selection line 22-1, output signals (signal charge components plus noise components) from the photodiodes 62a are output from the output circuits 68. As described above, since the noise components are stored in the clamp capacitors 132-1, 132-2, . . . , voltage changes on the vertical signal lines 8-1, 8-2, . . . , i.e., only the signal voltages without fixed pattern noise, obtained by subtracting the noise components from the signal components plus noise components, appear on clamp nodes 145-1, 145-2 . . . . The sample/hold transistors 133-1, 133-2, . . . have been turned on, and hence the same signal voltages have been appearing at the terminals of the sample/hold capacitors 134-1, 134-2, . . . .

The common gate 143 of the sample/hold transistors 133-1, 133-2, . . . is set at low level to turn off the sample/hold transistors 133-1, 133-2, . . . . At this time, the voltages without noise, appearing on the clamp nodes 145-1, 145-2, . . . , are held in the sample/hold capacitors 134-1, 134-2, . . . .

By sequentially applying horizontal address pulses to the horizontal selection transistors 12-1, 12-2, . . . , the signals without noise, which are supplied from the photodiodes 62*a* and stored in the sample/hold capacitors 134-1, 134-2, . . . , are read out from the output terminal (horizontal signal line) 15.

When a high-level address pulse is to be applied to the vertical address line 6-1 next, a high-level selection pulse is applied to the photodiode selection line 24-1 instead of the photodiode selection line 22-1 to cause the output circuits 68 to output the output signals from photodiodes 62*b*. Other operations are the same as those described above.

By repeating the above operation for the vertical address lines 6-2, 6-3, . . . in the same manner as described above, the signals in all the cells arranged two-dimensionally can be output.

Third Embodiment

Figure 21:
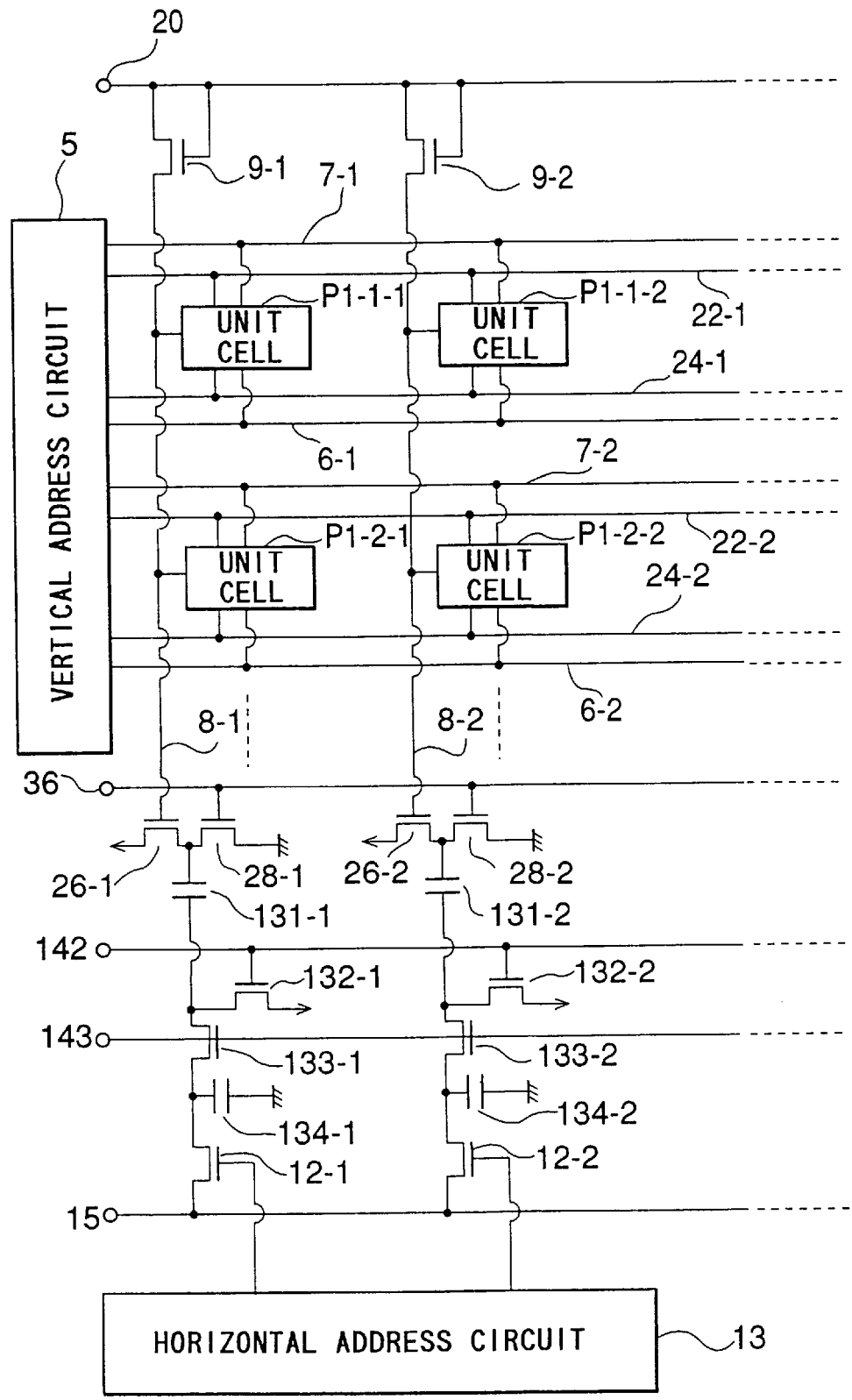
FIG. 21 is a circuit diagram showing the arrangement of an MOS-type solid-state imaging apparatus according to a third embodiment of the present invention.

FIG. 21 is a circuit diagram showing an imaging apparatus using an amplification-type MOS sensor according to the third embodiment of the present invention. The circuit structure of each unit cell P1-i-j is the same as that in the first embodiment.

In the third embodiment, the impedance converters in the first embodiment are connected to the noise cancelers in the second embodiment. Note that the common source of clamp transistors 132 is DC-driven in this embodiment.

Fourth Embodiment

Figure 22:
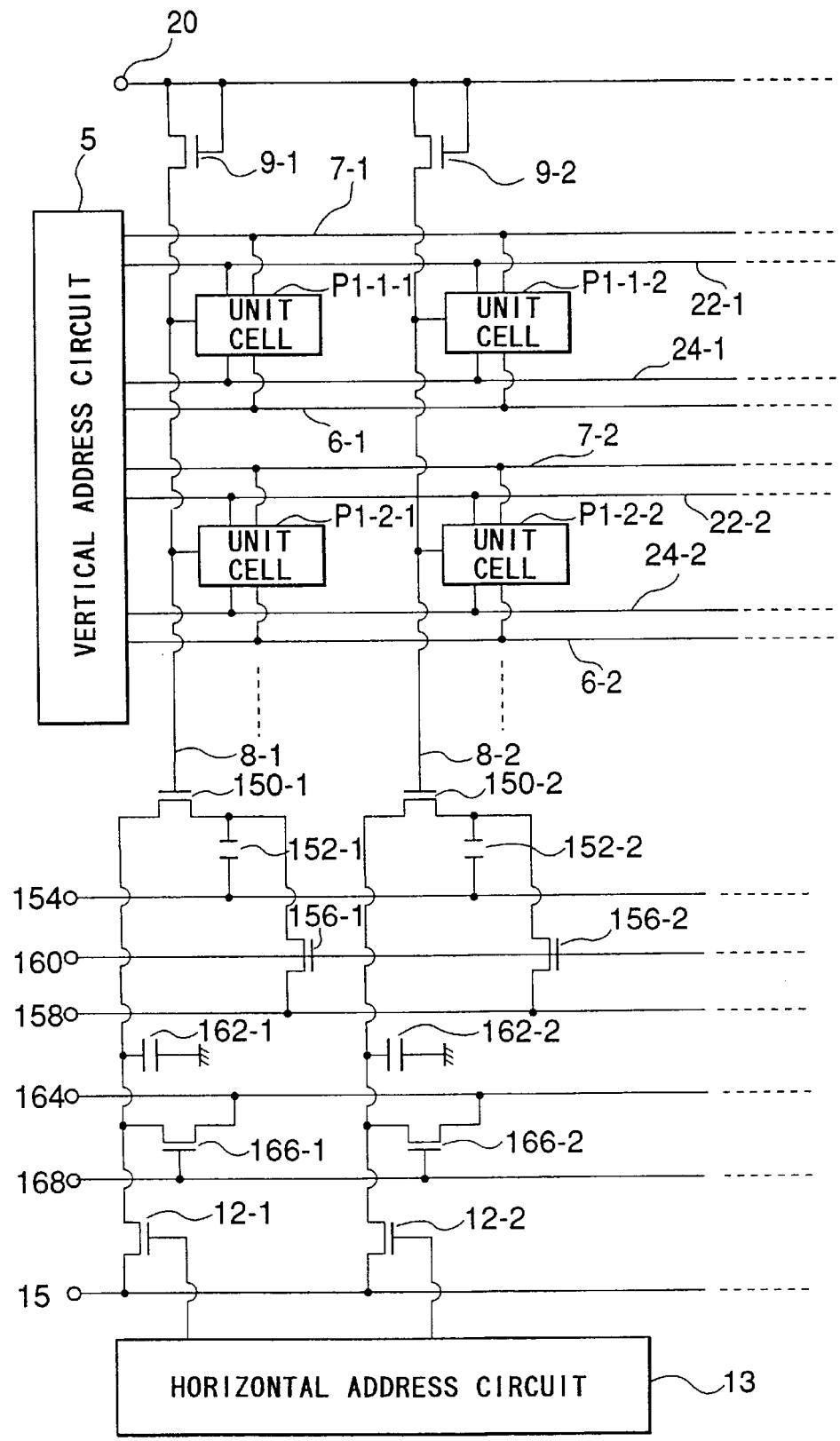
FIG. 22 is a circuit diagram showing the arrangement of an MOS-type solid-state imaging apparatus according to a fourth embodiment of the present invention.

FIG. 22 is a circuit diagram showing an imaging apparatus using an amplification-type MOS sensor according to the fourth embodiment of the present invention. The circuit structure of each unit cell P1-i-j is the same as that in the first embodiment.

The end portions of the vertical signal lines 8-1, 8-2, . . . on the opposite side to the load transistors 9-1, 9-2, . . . are respectively connected to the gates of slice transistors 150-1, 150-2, . . . . One end of each of slice capacitors 152-1, 152-2, . . . is connected to the source of a corresponding one of the slice transistors 150-1, 150-2, . . . . The other end of each of the slice capacitors 152-1, 152-2, . . . is connected to a slice pulse supply terminal 154. To reset the source potentials of the slice transistors 150-1, 150-2, . . . , slice reset transistors 156-1, 156-2, . . . are connected between the sources of the slice transistors and a slice power supply terminal 158. A slice reset terminal 160 is connected to the gates of the slice reset transistors 156-1, 156-2, . . . .

Slice charge transfer capacitors 162-1, 162-2, . . . are connected to the drains of the slice transistors 150-1, 150-2, . . . . To reset the drain potentials of the slice transistors 150-1, 150-2, . . . , drain reset transistors 166-1, 166-2, . . . are arranged between the drains of the slice transistors and a storage drain power supply terminal 164. The drain reset terminal 168 is connected to the gates of the drain reset transistors 166-1, 166-2, . . . . In addition, the drains of the slice transistors 150-1, 150-2, . . . are connected to a signal output terminal 15 through the horizontal selection transistors 12-1, 12-2, . . . which are driven by horizontal address pulses supplied from the horizontal address circuit 13.

As described above, the arrangement of each unit cell P1-i-j of the CMOS sensor in the fourth embodiment is the same as that in the first embodiment shown in FIG. 3, but the arrangement of each noise canceler portion differs from that in the first embodiment. The noise cancelers in the fourth embodiment are characterized in that voltages appearing on the vertical signal lines 8-1, 8-2, . . . are converted into charges through the gate capacitance of the slice transistors 150, and noise is suppressed by performing subtraction in the charge domain.

Figure 23:
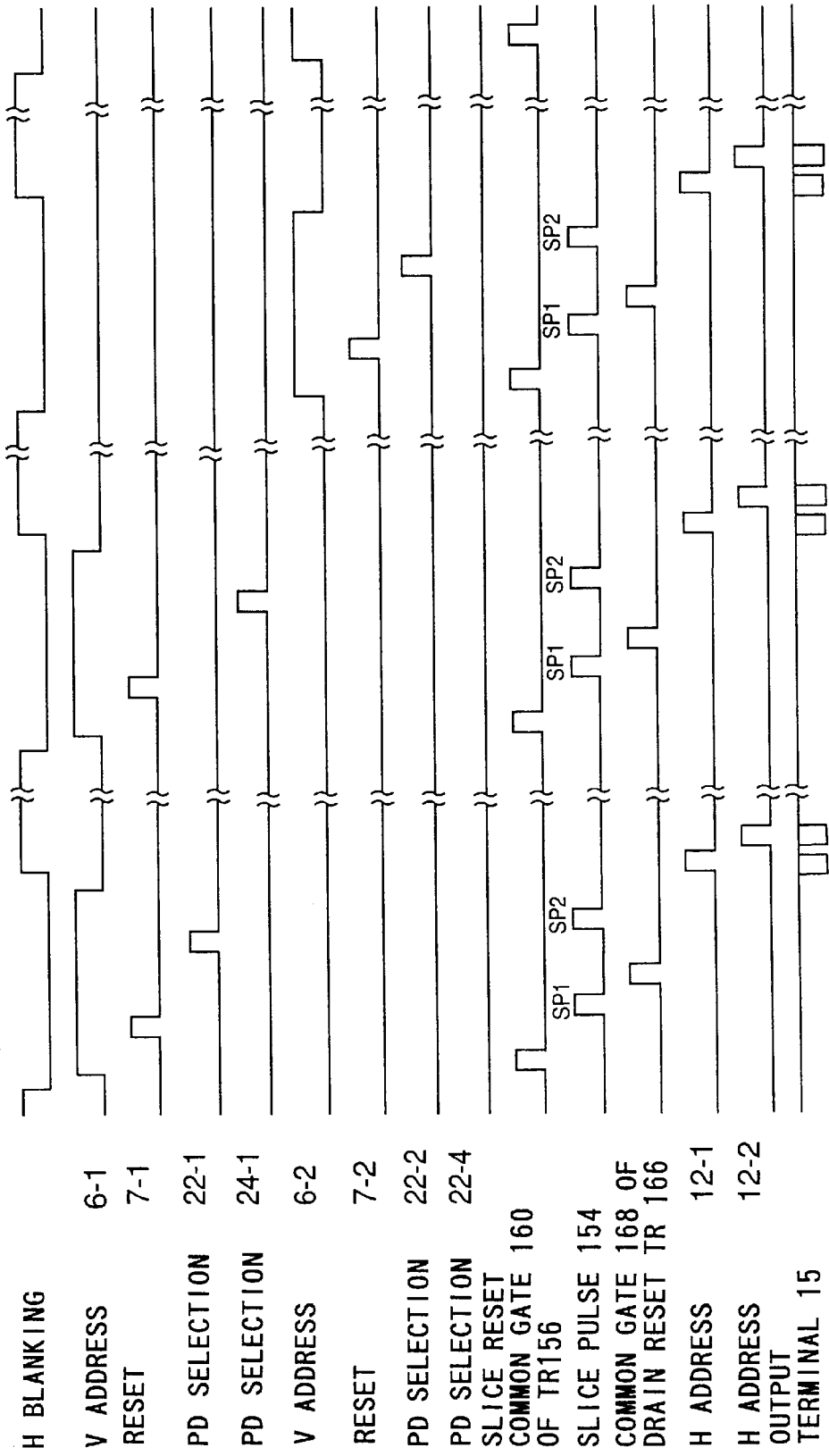
FIG. 23 is a timing chart showing the operation of the fourth embodiment.
Figure 24:
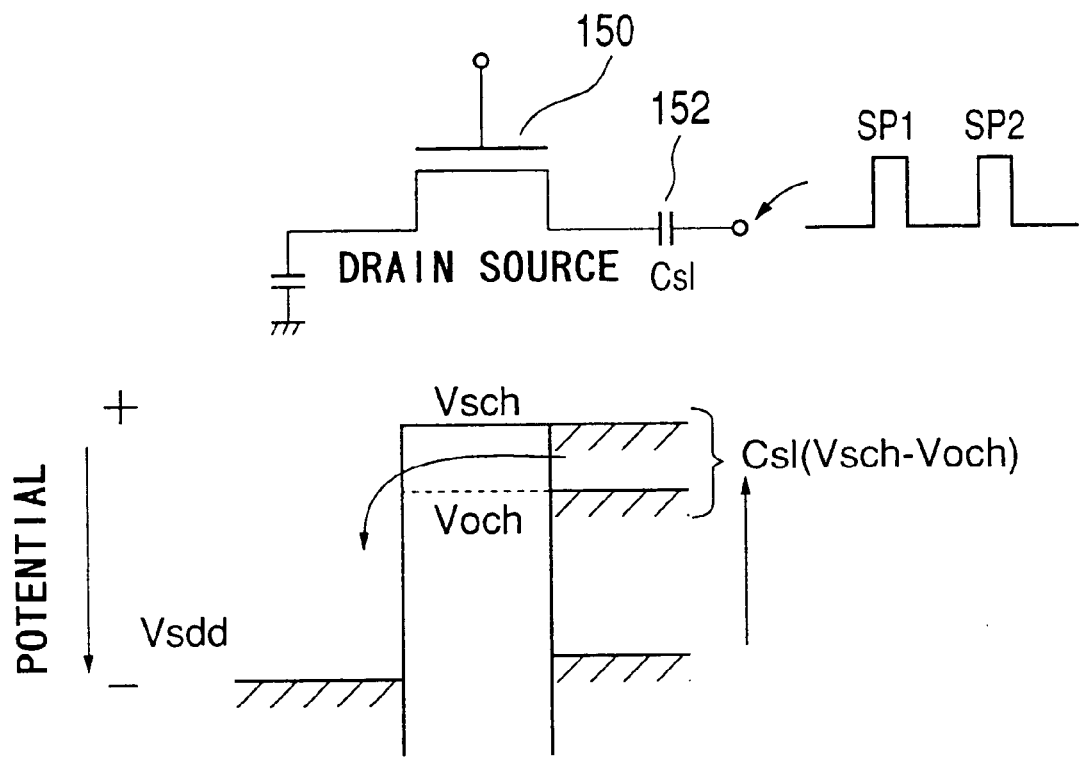
FIG. 24 is a potential chart of a slice transistor in the fourth embodiment.

A method of driving this embodiment will be described next. FIG. 23 is a timing chart showing the operation of the embodiment. FIG. 24 is a potential chart of each of the slice transistors 150-1, 150-2, . . . . In this case, each slice transistor is of a p-channel type.

When a high-level vertical address pulse is applied to the vertical address line 6-1 in the first row, only the vertical selection transistors 66 of the unit cells in this row are turned on, and source follower circuits are formed by the amplification transistors 64 in this row and the load transistors 9-1, 9-2, . . . .

Subsequently, a slice reset pulse is applied to the slice reset terminal 160 to turn on the slice reset transistors 156-1, 156-2, . . . and initialize the charges in the slice capacitors 152-1, 152-2, . . . .

The slice reset transistors 156 are turned off. When a high-level reset pulse is applied to the reset line 7-1 before or after this initialization, the reset transistors 66 of the unit cells P1-1-1, P1-1-2, . . . connected to the reset line 7-1 are turned on to reset the charges at the input terminals of the output circuits 68. With this operation, noise components corresponding to the threshold variations of the amplification transistors 64 in the absence of signal charges in photodiodes 62 are output from the output circuits 68. A first slice pulse SP1 is applied to the slice pulse supply terminal 154. With this operation, the first slice charge exceeds a channel potential $V_{och}$ under the gate of the slice transistor 150 in the absence of a signal, and is transferred to the drain. In this case, since a drain reset pulse is applied to the drain reset terminal 168 to turn on the drain reset transistor 166, the drain potential is fixed to a voltage $V_{sdd}$ of the storage drain power supply terminal 164. The first slice charge is therefore discharged to the storage drain power supply terminal 164 through the drain reset transistor 166.

When a high-level selection pulse is applied to the photodiode selection line 22-1 afterward, output signals (signal charge components plus noise components) from the photodiodes 62*a* are output from output circuit 68.

A second slice pulse SP2 is applied to the slice pulse supply terminal 154. With this operation, the second slice charge exceeds a channel potential $V_{sch}$ under the gate of the slice transistor 150 to which a voltage is being applied in the absence of a signal charge, and is transferred to the drain. In this case, since the drain reset transistor 166 is off, the second slice charge is transferred to the slice charge transfer capacitor 162.

A horizontal selection pulse is sequentially applied from the horizontal address circuit 13 to the horizontal selection transistors 12-1, 12-2, . . . to sequentially output signals corresponding to one line from the horizontal signal line 15. By sequentially performing this operation for the subsequent lines, all the signals in the two-dimensional matrix can be read out.

In this device, if the value of the slice capacitor 152 is represented by $C_{s1}$, the charge (second slice charge) to be finally output to the horizontal signal line 15 is given by $$C_{s1} \times (V_{sch} - V_{och}).$$

That is, the device is characterized in that fixed pattern noise due to threshold variations of the amplification transistor 64 in each unit cell is suppressed because the charge proportional to the difference between the voltage set when a signal is present and the voltage set when no signal is present after a reset operation, appears on the signal line. The circuit arrangement for converting a voltage appearing on the vertical signal line 8 into a charge, and performing subtraction in the charge domain in this manner can also be called a noise canceler.

For example, a noise canceling method of this type differs from that in the first embodiment in FIG. 3. In the first embodiment, at the clamp node 41, no noise is present in the voltage domain. That is, noise canceling is performed in the voltage domain. In contrast to this, in this type of method, at the source of the slice transistor 150, noise is not canceled in the voltage domain. When the second slice pulse SP2 is applied, however, the charge whose noise has been canceled is transferred to the drain for the first time. That is, the noise has been canceled in the charge domain.

As described above, according to the fourth embodiment, since an output from each unit cell is output through the noise canceler, fixed pattern noise due to threshold variations of the amplification transistor of the unit cell can be removed.

In addition, since an output from each unit cell is supplied to the noise canceler through the gate capacitance of the slice transistor, the impedance of the noise canceler remains almost the same, as viewed from the unit cell, in a noise output operation and a signal pulse noise output operation. For this reason, in both the output operations, the noise components are almost the same. When the difference between the noise components is obtained, the noise output can be accurately reduced, and only the signal component can be output, thereby accurately canceling the noise. Furthermore, when the noise canceler viewed from the unit cell, only the gate capacitance can be seen in terms of impedance. Since this capacitance is very small, the noise can be reliably canceled within a short period of time.

Note that the second slice pulse SP2 may be influenced by the immediately preceding first slice pulse SP1. The influences of the first and second slice pulses on the operations of the first and second transistors can be effectively equalized by inserting a dummy slice pulse immediately before the first slice pulse. If the first and second slice pulses have the same amplitude, the signal charge in a small signal region cannot be read out or a deterioration in linearity occurs depending on voltage conditions. For this reason, for stable operations, the amplitude of the second slice pulse is preferably set to be larger than that of the first slice pulse to add a bias charge to the charge to be read out with the second slice pulse. A method of setting the width of the second slice pulse to be larger than that of the first slice pulse can also be used effectively.

Fifth Embodiment

Figure 25:
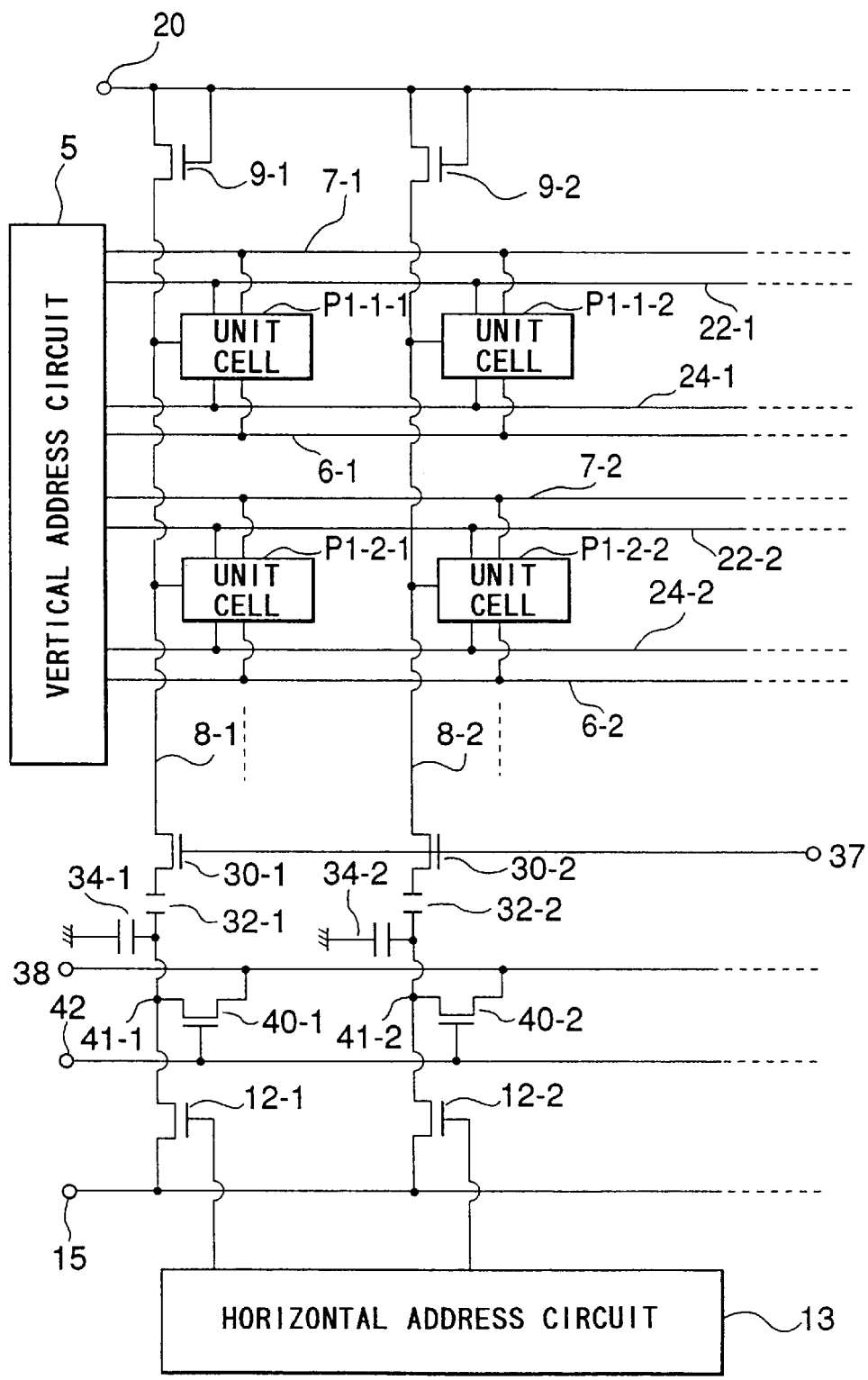
FIG. 25 is a circuit diagram showing the arrangement of an MOS-type solid-state imaging apparatus according to a fifth embodiment of the present invention.

FIG. 25 is a circuit diagram showing an imaging apparatus using an amplification-type MOS sensor according to the fifth embodiment of the present invention. The circuit arrangement of each unit cell P1-i-j is the same as that in the first embodiment.

In the fifth embodiment, the impedance converters in the first embodiment in FIG. 3 are omitted.

Sixth Embodiment

Figure 26:
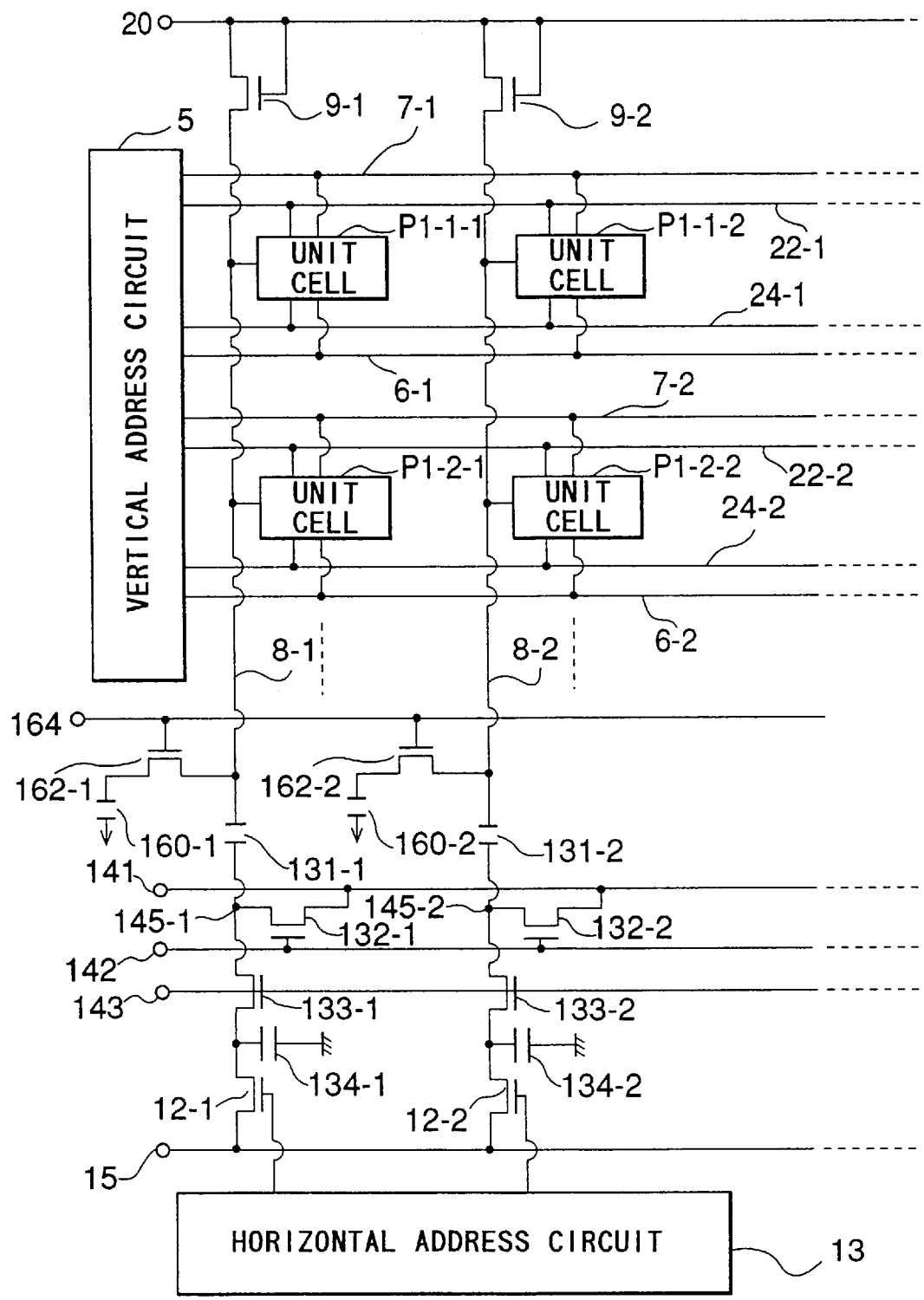
FIG. 26 is a circuit diagram showing a first example of an arrangement of an MOS-type solid-state imaging apparatus according to a sixth embodiment of the present invention.
Figure 27:
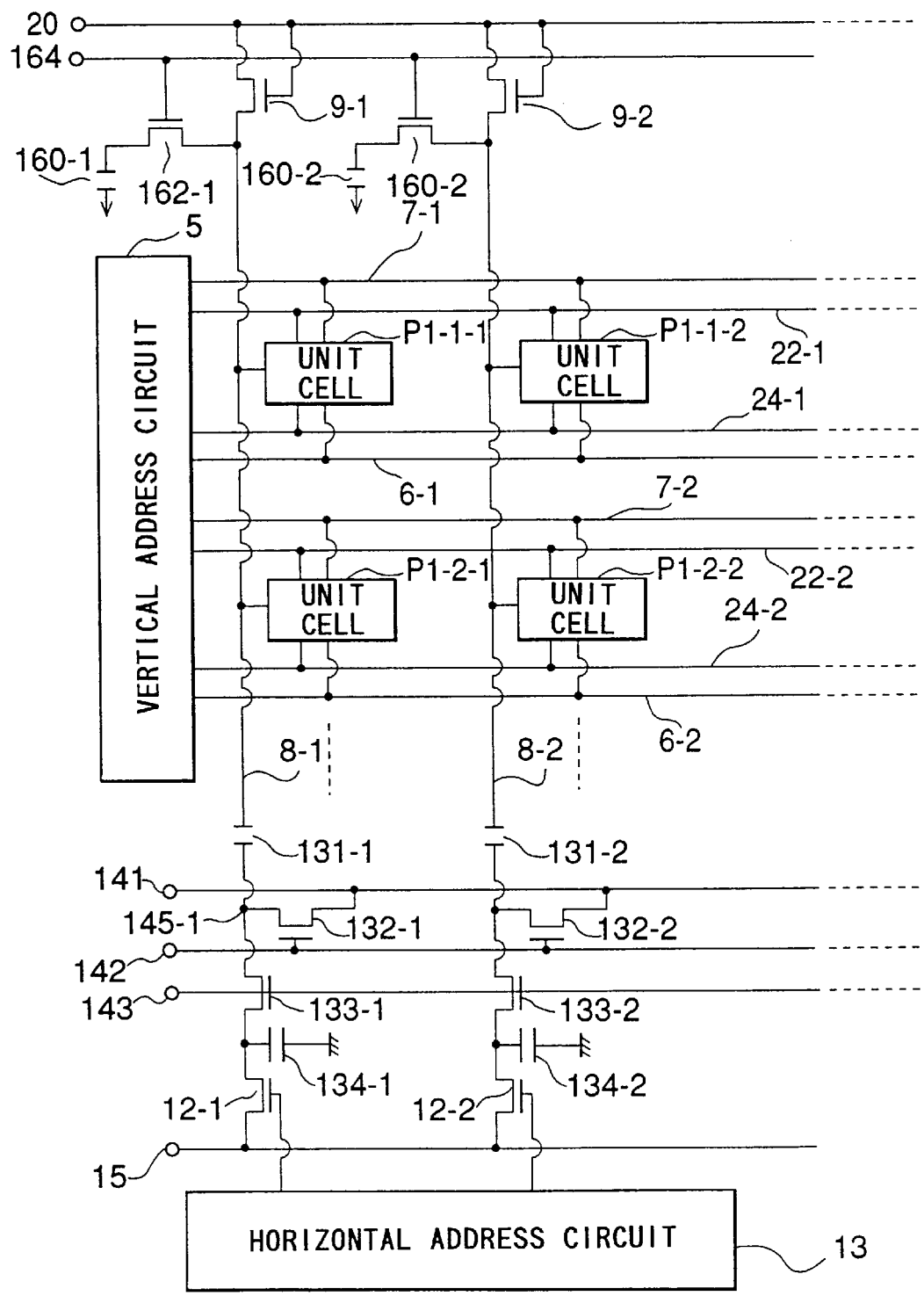
FIG. 27 is a circuit diagram showing a second example of an arrangement of an MOS-type solid-state imaging apparatus according to the sixth embodiment of the present invention.

FIGS. 26 and 27 are circuit diagrams each showing the circuit arrangement of an imaging apparatus using an amplification-type MOS sensor according to the sixth embodiment of the present invention. The circuit arrangement of each unit cell P1-i-j is the same as that in the first embodiment.

Although this embodiment and the second embodiment in FIG. 19 have many common parts, they differ in that capacitors $C_{CMP}$ 160-1, 160-2, . . . for correcting the differences between the impedances of the noise cancelers, viewed from the unit cell, in a signal pulse noise output operation and in a noise output operation are connected in parallel with the vertical signal lines 8-1, 8-2, . . . through switches 162-1, 162-2, . . . so as to be located on the imaging region (unit cell) side with respect to clamp capacitors 131-1, 131-2, . . . . In the case shown in FIG. 26, the correction capacitor 160 and a switch 162 are connected between a clamp capacitor 131 and the imaging region. In the case shown in FIG. 27, the correction capacitor 160 and the switch 162 are connected between the imaging region and the load transistor 9.

Figure 28:
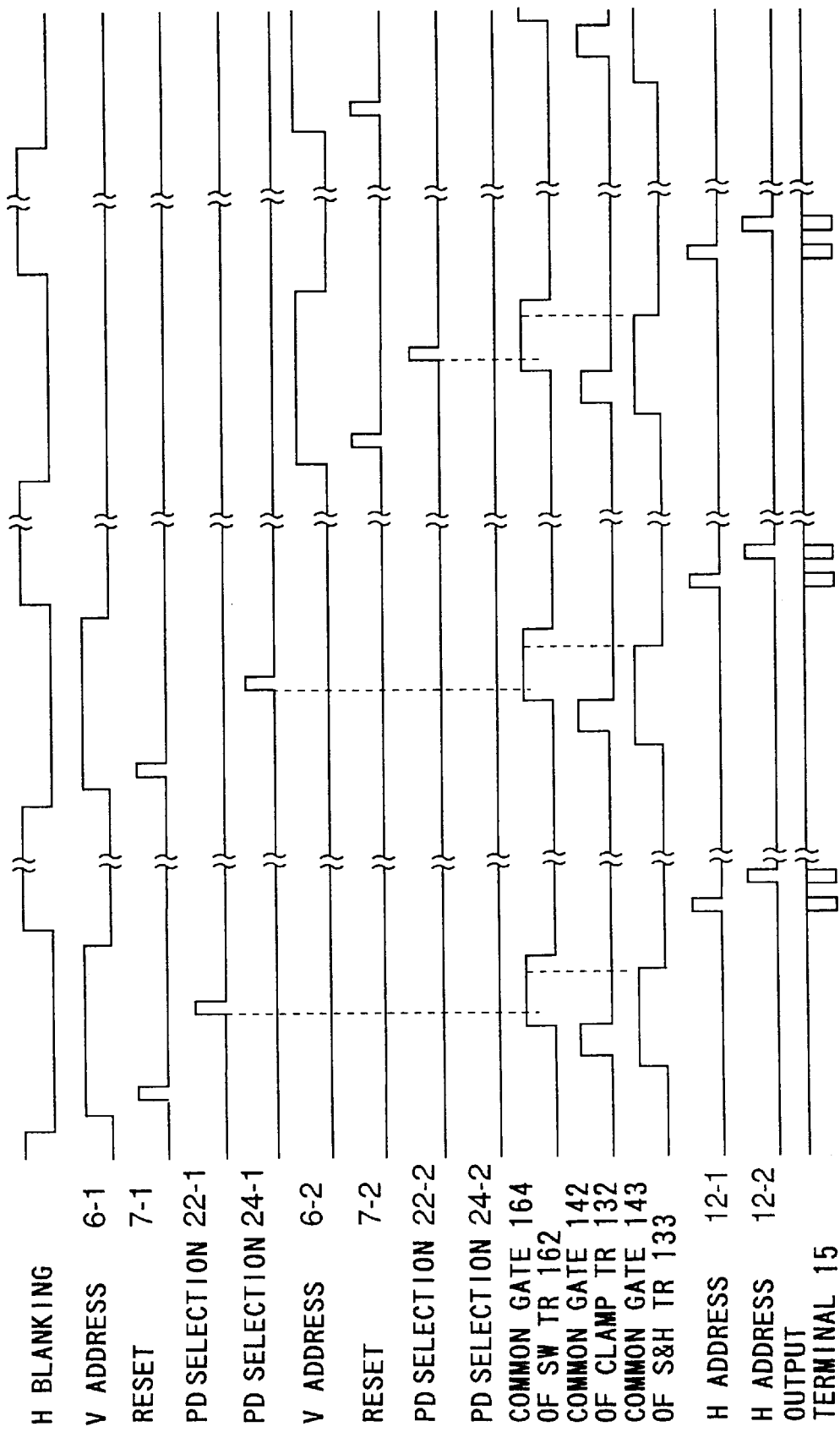
FIG. 28 is a timing chart showing the operation of the sixth embodiment.

FIG. 28 shows the operation timing of this embodiment. The switch 162 is turned on in an interval in which a signal is output to the vertical signal line after a clamp operation is completed by a clamp transistor 132. The phases of pulses must be set such that a common gate 164 of the switching transistors 162-1, 162-2, . . . is set at high level at the fall of a pulse applied to a common gate 143 of the sample/hold transistors 133-1, 133-2, . . . . In addition, the common gate 164 of the switching transistors 162-1, 162-2, . . . preferably rises before a photodiode selection transistor 22-1 (or 24-1) turns on. This rise, however, must take place after the fall of a clamp pulse. In this case, letting $C_{SH}$ be a sample/hold capacitor 134 and $C_{CL}$ be the clamp capacitor 131, the capacitor connected to the vertical signal line 8 in a sample/hold operation is given by $$C = C_{CMP} + C_{SH} \cdot C_{CL}/(C_{CL} + C_{SH})$$

If the correction capacitor $C_{CMP}$ is set with the following range:

$$2\{C_{CL} - C_{CL} \cdot C_{SH}/(C_{CL} + C_{SH})\} > C_{CMP} > 0$$

the capacitor connected to the vertical signal line becomes closer to the capacitor $C_{CL}$ of the clamp capacitor 131 than the capacitor without any correction capacitor. For this reason, the difference $V_{CL}$ decreases, and the noise also decreases.

Figure 29:
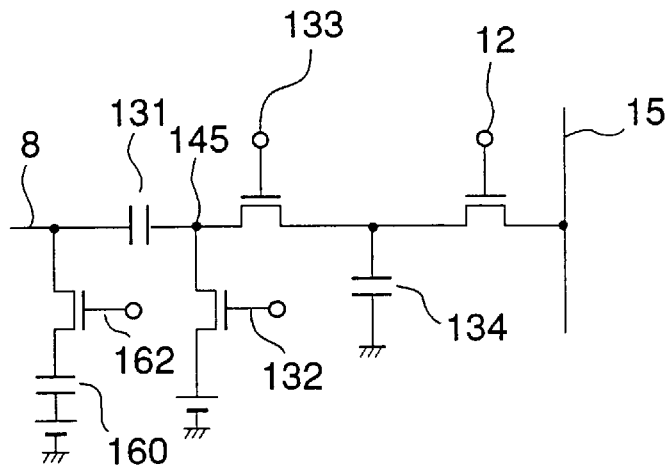
FIG. 29 is a potential chart of a noise canceler in the sixth embodiment.
Figure 29:
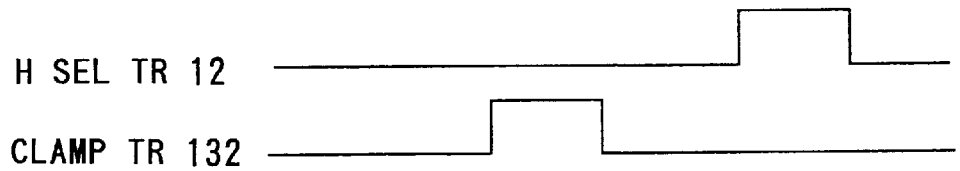
Figure 29:
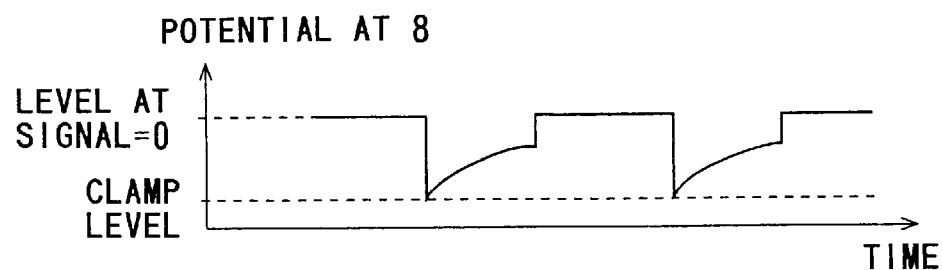
Figure 29:
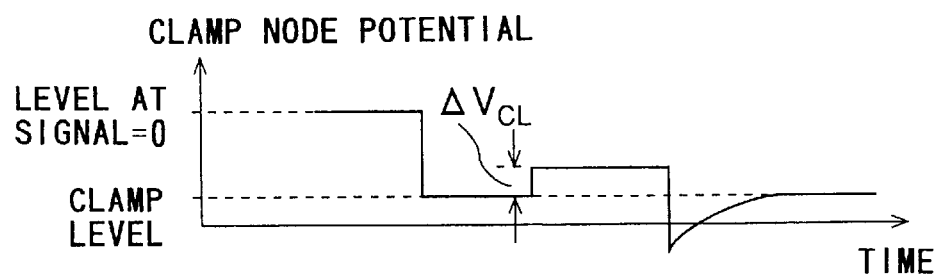

FIG. 29 shows changes in the potential of the vertical signal line 8 and the potential of the clamp node 145 with time. In this embodiment, when the potential of the vertical signal line 8 returns to the same potential in a clamp operation and a sample/hold operation, as in a dark period during which a signal is zero, the potential of the clamp node at the end of a sample/hold operation becomes 0 without returning to a value near $\Delta V_{CL}$. This can therefore prevent troubles, e.g., appearance of a signal corresponding to $\Delta V_{CL}$ in a dark period during which a signal is zero. Consequently, noise due to variations in $\Delta V_{CL}$ can be prevented.

As described above, according to this embodiment, in the MOS-type solid-state imaging apparatus with the noise reduction circuits, the correction capacitors 160 are connected to the vertical signal lines 8 to suppress capacitance changes in a noise reducing operation which are the cause of noise, thus further contributing to noise reduction. That is, since the impedance viewed from each cell remains the same in a signal plus noise output operation after selection of a photodiode and in a noise output operation after a reset operation, noise canceling can be accurately performed.

Modifications of the sixth embodiment may be made such that correction capacitors are connected to the noise cancelers in the first embodiment in FIG. 3, the third embodiment in FIG. 21, and the fifth embodiment in FIG. 25.

The second to sixth embodiments described above differ from the first embodiment in the noise canceler circuit portions. Other embodiments which differ from the first to sixth embodiments in the structure of each unit cell will be described next.

Seventh Embodiment

Figure 30:
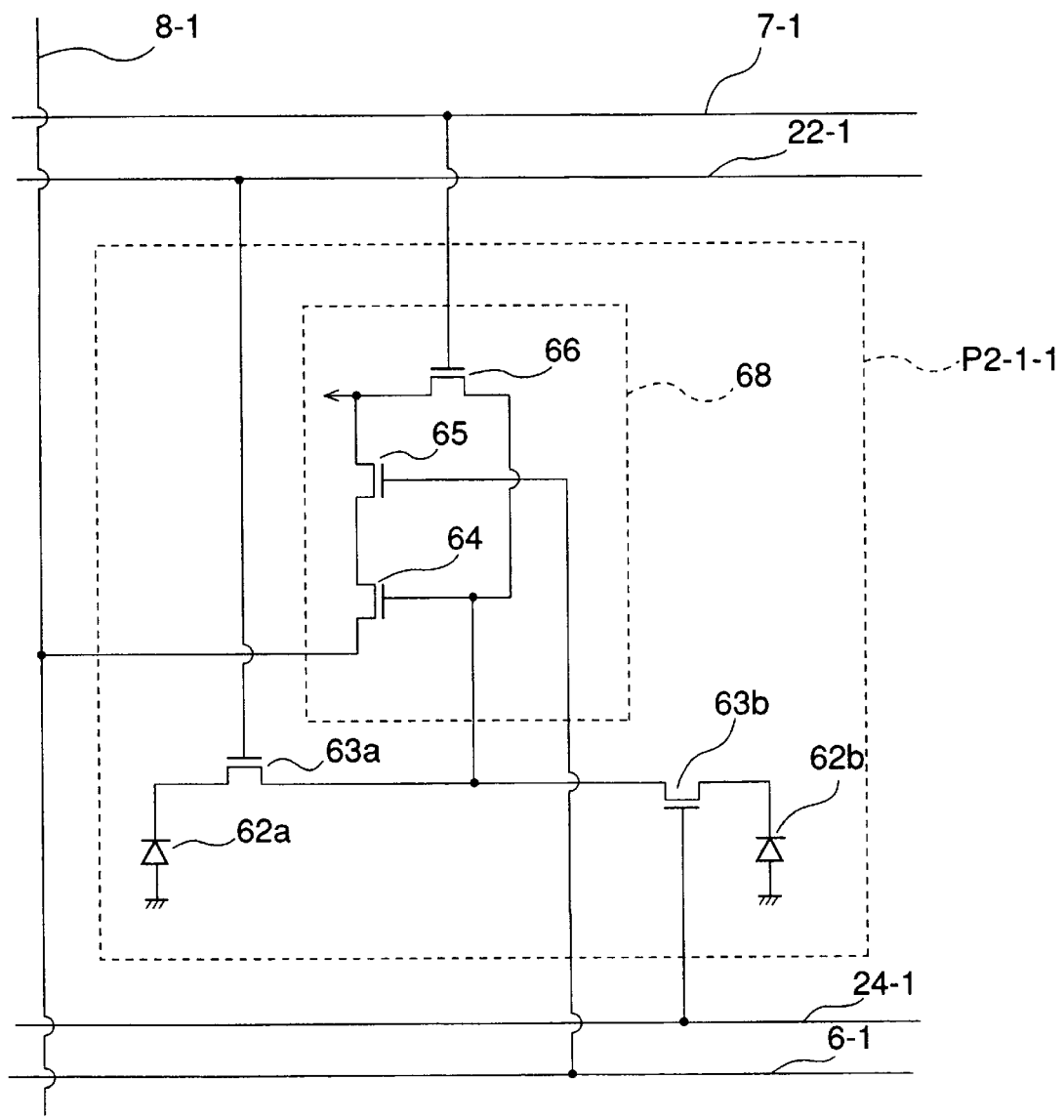
FIG. 30 is a circuit diagram showing an arrangement of an MOS-type solid-state imaging apparatus according to a seventh embodiment of the present invention.

Since the overall arrangement of this embodiment is the same as that of the first embodiment shown in FIG. 3, an illustration of the arrangement will be omitted. Note that this embodiment is characterized in that a unit cell P2 shown in FIG. 30 is used in place of the unit cell P1 in FIG. 3.

The unit cell P2 in this embodiment is characterized in that the photodiodes 62a and 62b are arranged to be adjacent to each other in the horizontal direction instead of the vertical direction, and are connected to the source of the reset transistor 66 and the gate of the amplification transistor 64 through the photodiode selection transistors 63a and 63b so as to share one output circuit 68.

Figure 31:
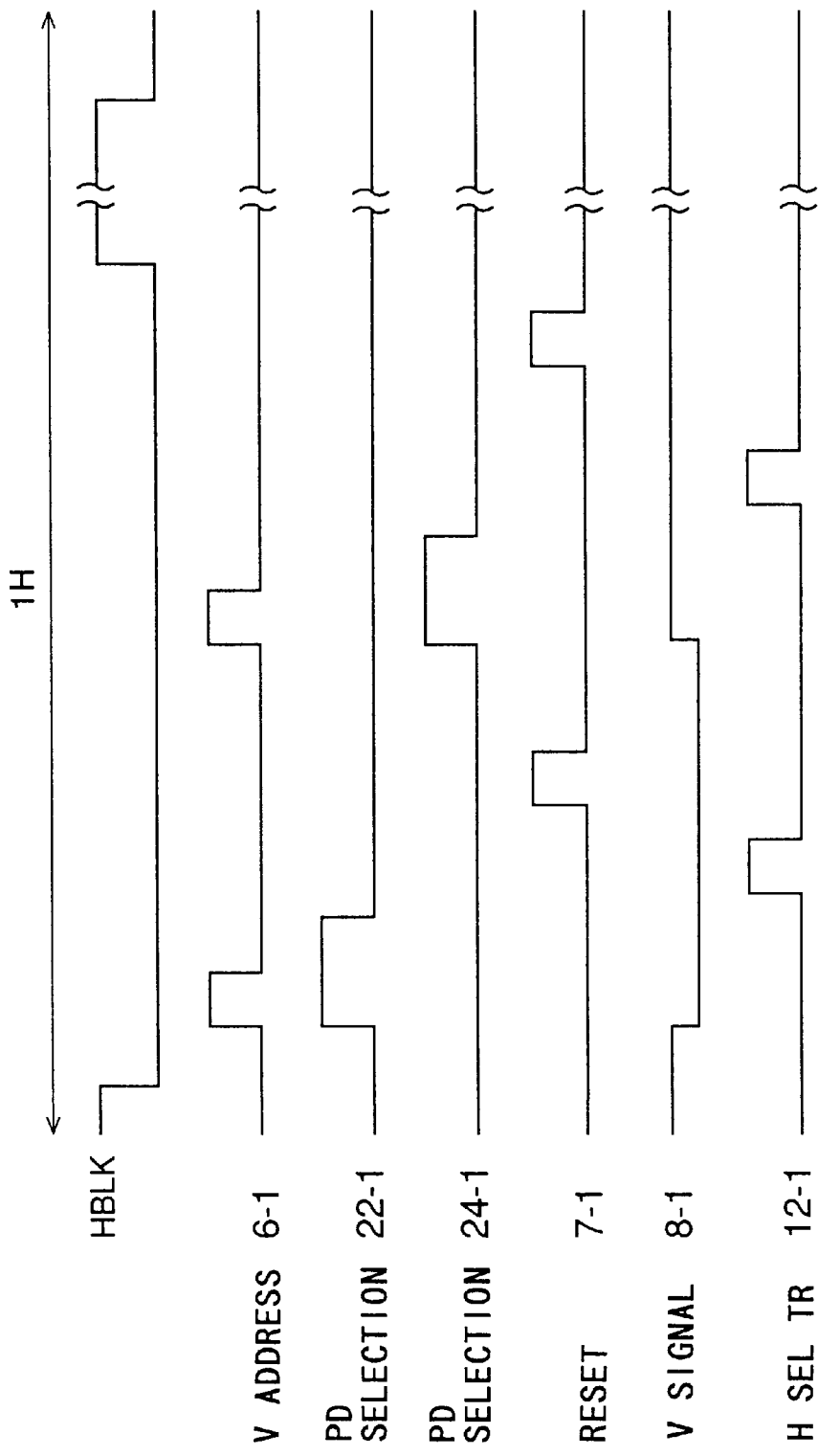
FIG. 31 is a timing chart showing the operation of the seventh embodiment.

The operation of this embodiment will be described next with reference to the timing chart of FIG. 31.

First of all, in a horizontal blanking interval, the vertical address line 6-1 and the photodiode selection line 22-1 are set at high level to turn on the vertical selection transistor 65 and the photodiode selection transistor 63a.

As a result, almost the same voltage as that of the photodiode 62a appears on the gate of the amplification transistor 64. In addition, a source follower circuit is constituted by the amplification transistor 64 and the load transistor 9-1, and almost the same voltage as that of the amplification transistor 64 appears on the vertical signal line 8-1.

Subsequently, the vertical address line 6-1 is set at low level to turn off the vertical selection transistor 65. As a result, the source follower circuit stops operating. However, the potential of the vertical signal line 8-1 does not immediately change, and almost the same voltage as the gate voltage of the amplification transistor 64 before the reset operation is kept.

The reset line 7-1 is set at high level to turn on the reset transistor 66 to initialize the potentials of the gate of the amplification transistor 64 and the photodiode 62a.

A horizontal address pulse from the horizontal address circuit 13 is applied to the horizontal selection transistor 12-1 to output the signal obtained by the photodiode 63a from the horizontal signal line 15.

In the same horizontal blanking interval, the photodiode selection transistor 63b is turned on instead of the photodiode selection transistor 63a in the same operation as that described above. As a result, the signal obtained by the photodiode 63b is output from the horizontal signal line 15.

Although not shown, in this horizontal blanking interval, the horizontal address is sequentially changed with the same vertical address to sequentially output signals corresponding to one line. In the next horizontal blanking interval, the same operation as the above operation is performed for the next vertical address, thereby sequentially outputting signals corresponding to each line.

As described above, in addition to the effects of the first embodiment, the MOS-type solid-state imaging apparatus of this embodiment has the following advantage. Since each vertical address line is turned on/off only in a given horizontal interval in a given frame period, control on each vertical address line (the arrangement of the vertical address circuit) can be simplified.

In the seventh embodiment, as in the first embodiment, the noise canceler portion can be modified. That is, the description made with reference to FIGS. 3 to 29 also applies to the seventh embodiment. In addition, the number of photodiodes included in each unit cell in the seventh embodiment and arranged to be adjacent to each other in the horizontal direction is not limited to two, and may be three or more. As shown in FIG. 18, each output circuit may use a vertical selection capacitor instead of a vertical selection transistor.

Eighth Embodiment

Figure 32:
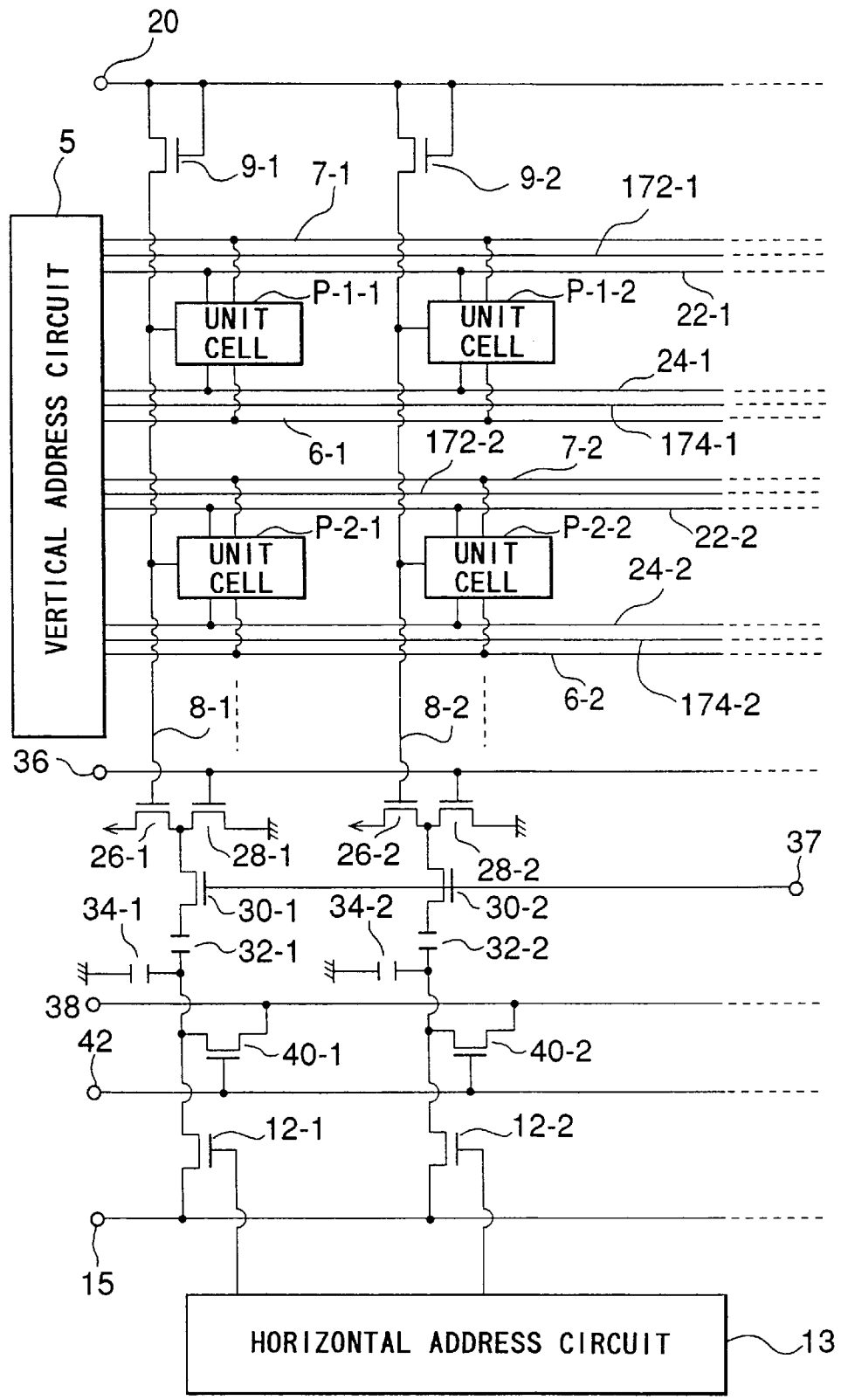
FIG. 32 is a circuit diagram showing an arrangement of an MOS-type solid-state imaging apparatus according to an eighth embodiment of the present invention.

FIG. 32 shows the arrangement of an MOS-type solid-state imaging apparatus according to the eighth embodiment. Unit cells P3-i-j are arranged in the form of a two-dimensional matrix.

Figure 33:
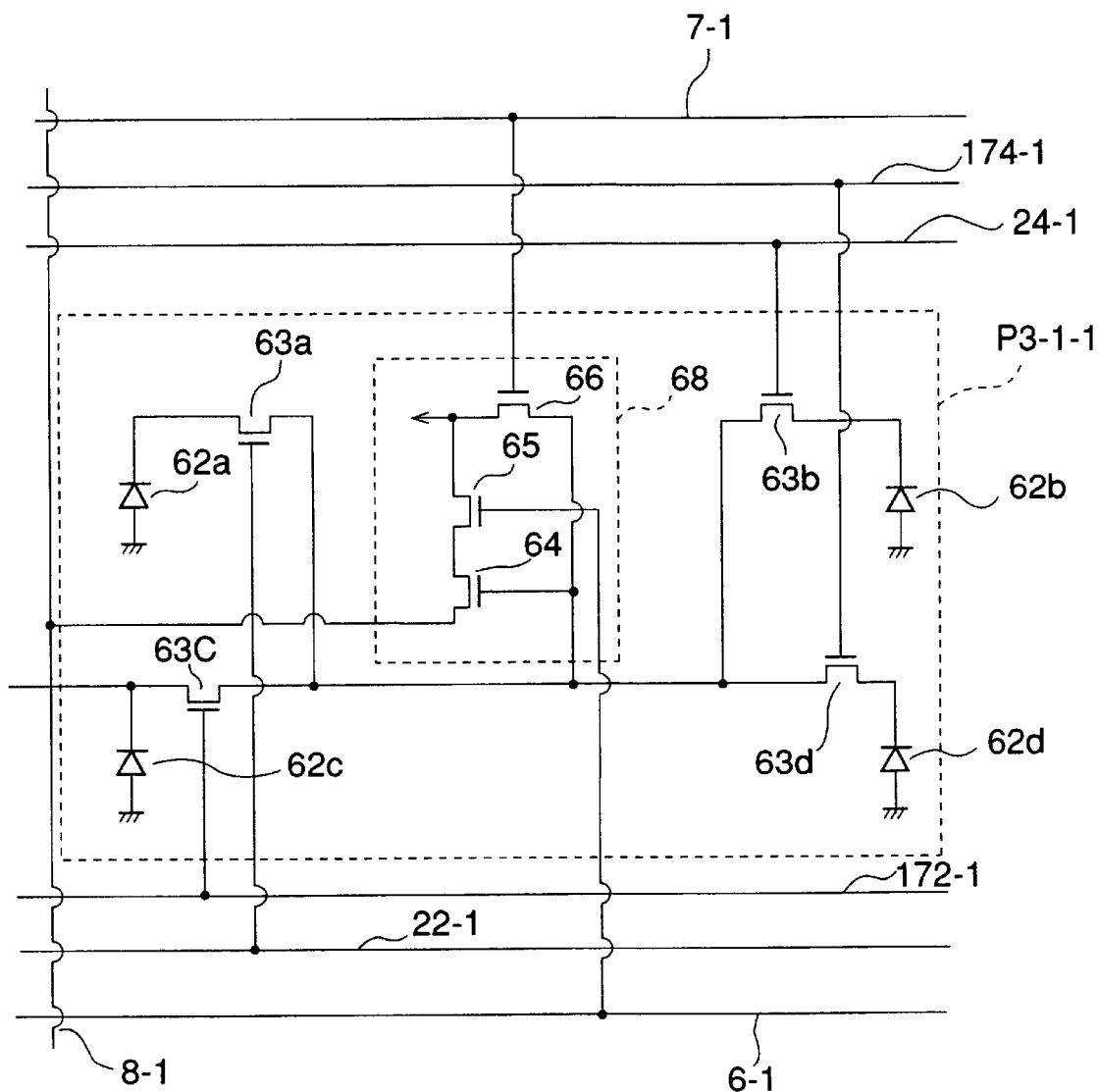
FIG. 33 is a circuit diagram showing a unit cell in the eighth embodiment.

FIG. 33 shows the arrangement of the unit cell P3-1-1 in FIG. 32. Although FIG. 33 shows the arrangement of only the unit cell P3-1-1, the same arrangement is used for each of the remaining unit cells P3-1-2, . . . .

As shown in FIG. 33, each unit cell of the MOS-type solid-state imaging apparatus of this embodiment is constituted by four photodiodes 62a to 62d, four photodiode selection transistors 63a to 63d, and one output circuit 68. The four photodiodes are arranged in a 2 (row)×2 (column) matrix.

The photodiodes 62a to 62d are connected to the common output circuit 68 through the selection transistors 63a to 63d. The selection transistors 63a to 63d are independently ON/OFF-controlled by photodiode selection lines 22-1, 24-1, 172-1, and 174-1 horizontally extending from the vertical address circuit 5.

With this arrangement of the unit cell P3-1-1 in which one common output circuit 68 is connected to the four photodiodes 62a to 62d, three output circuits can be omitted as compared with each unit cell of the conventional MOS-type solid-state imaging apparatus.

As described above, according to the MOS-type solid-state imaging apparatus of this embodiment, a combination of the effects of the first and second embodiments can be obtained.

In the eighth embodiment, as in the first embodiment, the noise canceler portion can be modified. That is, the description made with reference to FIGS. 3 to 29 also applies to the eighth embodiment. In addition, the number of photodiodes included in each unit cell in the eighth embodiment is not limited to 2 (row)×2 (column). A matrix constituted by 3×3 photodiodes or more may be used. The matrix to be used need not be square. As shown in FIG. 18, each output circuit may use vertical selection capacitors in place of vertical selection transistors.

Figure 1:
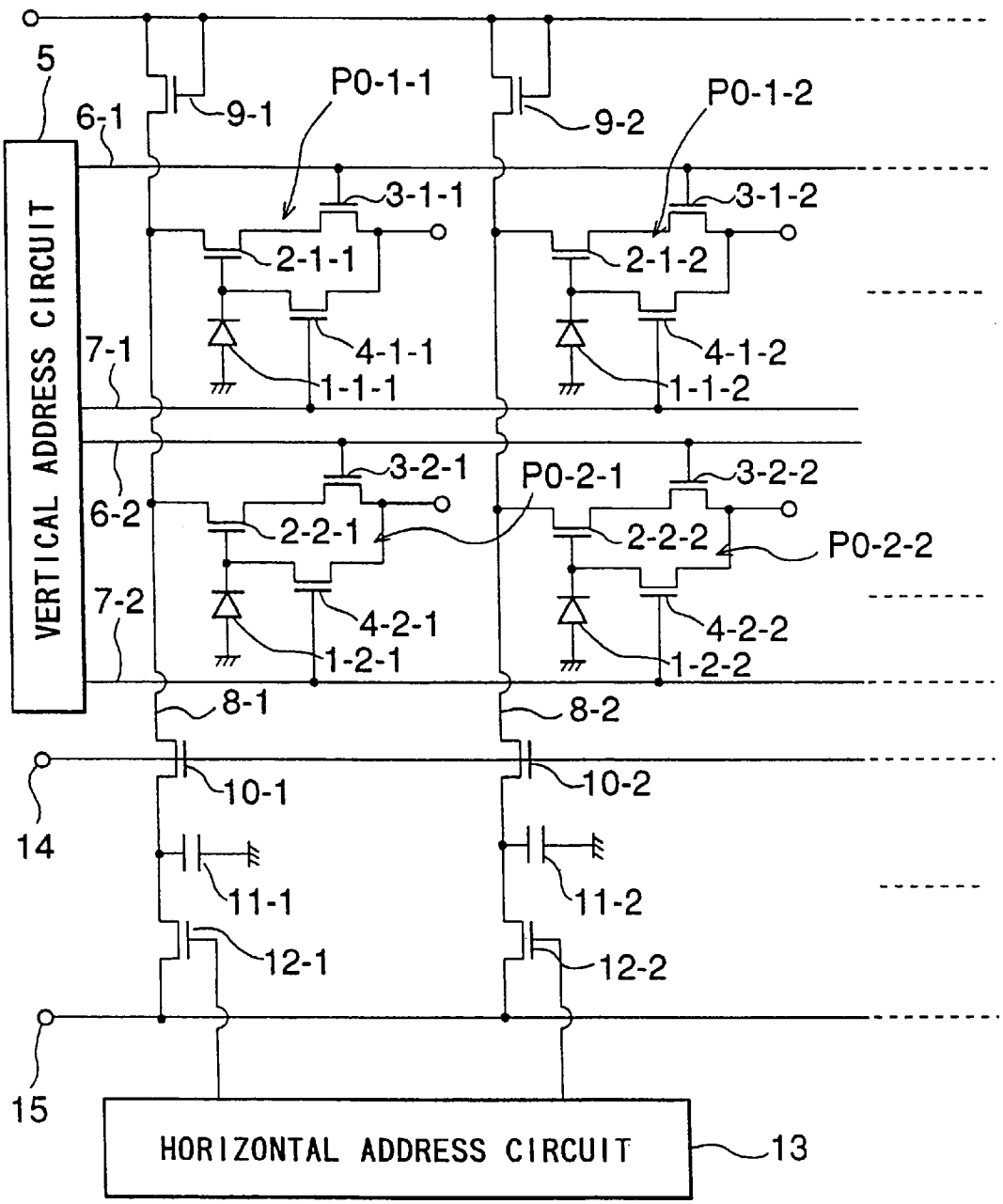
FIG. 1 is a circuit diagram showing the arrangement of a conventional MOS-type solid-state imaging apparatus.
Figure 2:
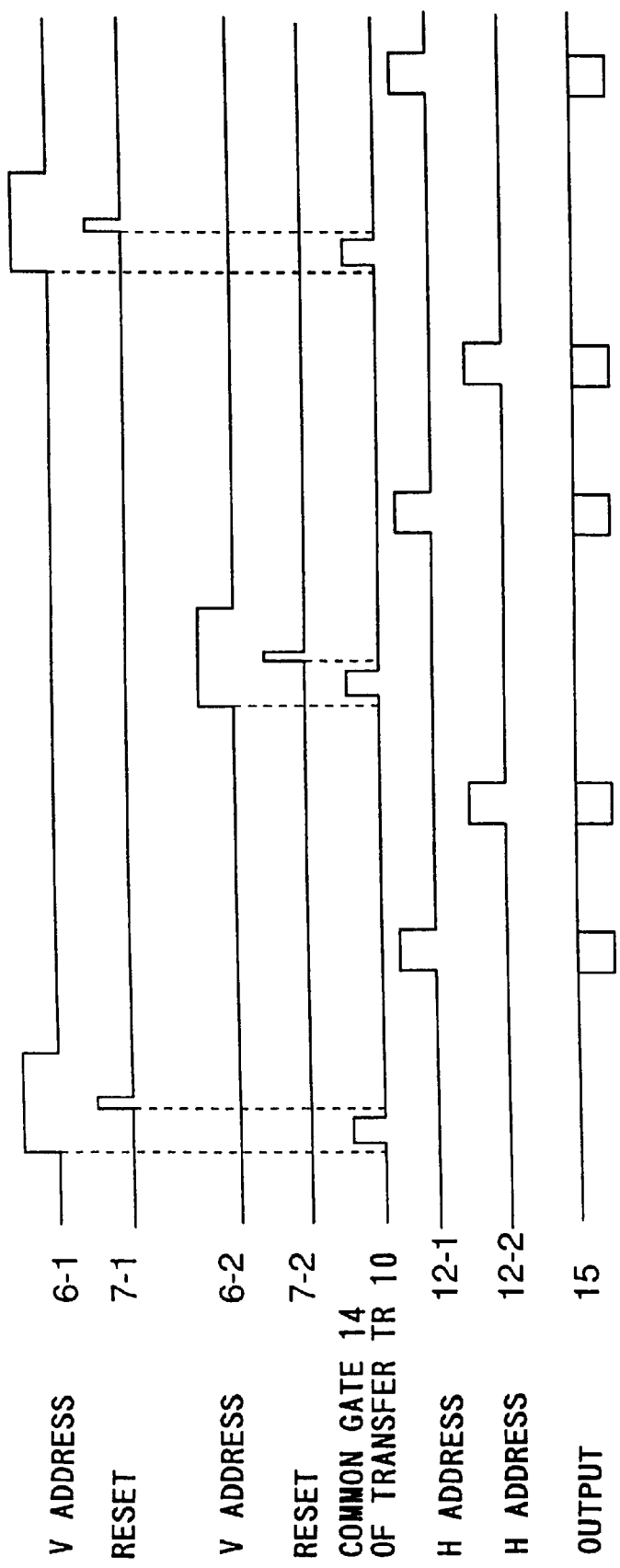
FIG. 2 is a timing chart showing the operation of the conventional apparatus shown in FIG. 1.

The present invention is not limited to the above embodiments, and can be variously modified. If, for example, the amplification transistors of unit cells can be manufactured without any threshold variation, since no fixed pattern noise is caused, the noise cancelers can be omitted. If fixed pattern noise exerts no influence on the image quality, the noise cancelers can be also omitted. In this case, a circuit like the one shown in FIG. 1 is connected between the vertical signal lines and the output terminal 15.

Although the gate and source of each load transistor are connected to the same power supply line, they may be connected to different power supplies. With this arrangement, a current flowing in each transistor can be controlled, and the power consumption can be reduced.

Figure 34:
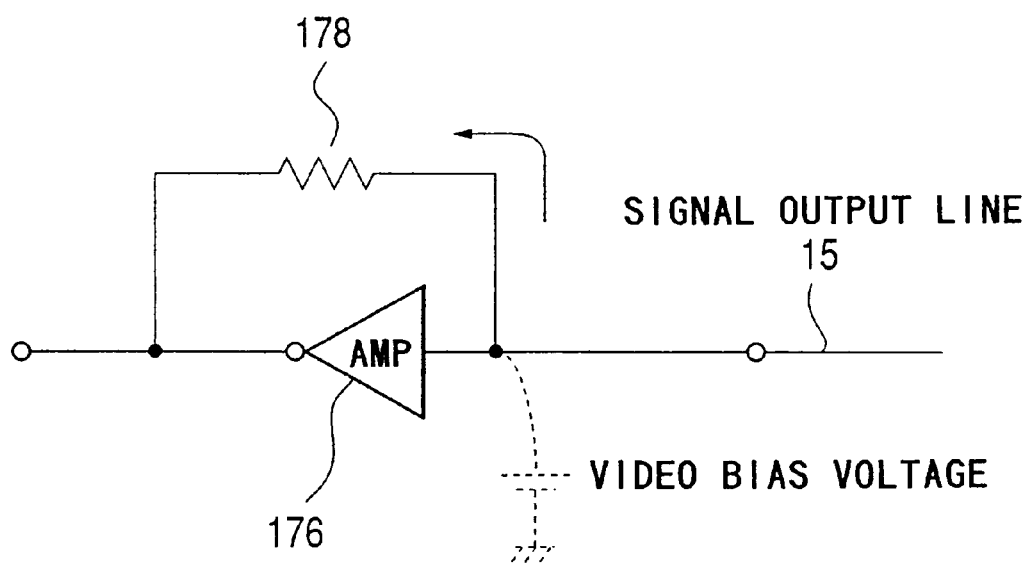
FIG. 34 is a circuit diagram showing a video amplifier connected to a horizontal signal line in a modification of the present invention.

In each noise canceler in each embodiment, since noise decreases as the signal current (only the noise component) read out in the absence of an input signal decreases, the voltage applied to the storage drain power supply terminal is preferably set to be almost equal to a video bias voltage. The video bias voltage is a voltage to which the horizontal signal line 15 is almost fixed when a signal is read out from the horizontal signal line 15 with a current. FIG. 34 shows a modification which realizes this arrangement. An operational amplifier 176 is connected to the output signal line 15, and a load resistor 178 is connected between the input and output terminals of the operational amplifier 176. According to this arrangement, a signal current is forcibly supplied to the load resistor 178, so that the horizontal signal line 15 is fixed to a virtual voltage, i.e., a video bias voltage.

In each embodiment described above, the unit cells are arranged in the form of a two-dimensional matrix. As is obvious, however, the present invention can be applied to an imaging apparatus having a one-dimensional array of unit cells. In this case, the photodiodes in each unit cell can be arrayed in the vertical or horizontal direction or arranged in the form of a matrix in both the directions.

As has been described above, according to the present invention, there is provided an MOS-type solid-state imaging apparatus which can attain a reduction in size.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. A MOS-type solid-state imaging apparatus comprising:
   unit cells arranged in an array;
   a first selector for selecting a row of the unit cells at a first interval;
   a second selector for selecting a column of the unit cells at a second interval which is shorter than the first interval;
   wherein each of said unit cells comprises:
   photoelectric converters;
   plural selection means respectively connected to said photoelectric converters and selecting one of output signals from said photoelectric converters; and
   output means for receiving one of the output signals from said photoelectric converters which is selected by said plural selection means, amplifying the output signal, and outputting an amplified signal, the output means being activated at the first interval.

2. A MOS-type solid-state imaging apparatus according to claim 1, in which said photoelectric converters are connected in parallel to said output means.

3. A MOS-type solid-state imaging apparatus according to claim 2, in which said photoelectric converters are connected in series to said output means.

4. A MOS-type solid-state imaging apparatus according to claim 1, in which said unit cells are arranged in a two-dimensional matrix, and said photoelectric converters are arrayed in the vertical direction in each of said unit cells.

5. A MOS-type solid-state imaging apparatus according to claim 4, in which said first selector controls said plural selection means.

6. A MOS-type solid-state imaging apparatus according to claim 1, in which said unit cells are arranged in a two-dimensional matrix, and said photoelectric converters are arrayed in the horizontal direction in each of said unit cells.

7. A MOS-type solid-state imaging apparatus according to claim 6, in which said first selector controls said plural selection means.

8. A MOS-type solid-state imaging apparatus according to claim 1, in which said unit cells are arranged in a two-dimensional matrix, and said photoelectric converters are arranged in a two-dimensional matrix in each of said unit cells.

9. A MOS-type solid-state imaging apparatus according to claim 8, in which said first selector controls said plural selection means.

10. A MOS-type solid-state imaging apparatus according to claim 1, in which said unit cells are arranged in a one-dimensional array, and said photoelectric converters are arrayed in a direction perpendicular to the array of the unit cells in each of said unit cells.

11. A MOS-type solid-state imaging apparatus according to claim 1, in which said unit cells are arranged in a one-dimensional array, and said photoelectric converters are arrayed in a direction parallel to the array of the unit cells in each of said unit cells.

12. A MOS-type solid-state imaging apparatus according to claim 1, in which said unit cells are arranged in a one-dimensional array, and said photoelectric converters are arranged in the form of a matrix in each of said unit cells.

13. A MOS-type solid-state imaging apparatus according to claim 1, in which said unit cell comprising an amplification transistor for amplifying one of the output signals from said photoelectric converters which is selected by said plural selection means, a reset transistor for resetting the output signal from said photoelectric converter, and a selection transistor for selecting said amplification transistor.

14. A MOS-type solid-state imaging apparatus according to claim 1, in which said unit cell comprising an amplification transistor for amplifying one of the output signals from said photoelectric converters which is selected by said plural selection means, a reset transistor for resetting the output signal from said photoelectric converter, and a selection capacitor for selecting said amplification transistor.

15. A MOS-type solid-state imaging apparatus comprising unit cells each of which includes a photoelectric converter and is formed on a semiconductor substrate,
   wherein said semiconductor substrate comprises a $p^-$-type impurity base layer and a $p^+$-type impurity layer formed thereon, and
   said unit cells are formed in said $p^+$-type impurity layer.

16. A MOS-type solid-state imaging apparatus comprising unit cells formed on a semiconductor substrate,
   wherein said semiconductor substrate comprises a $p^-$-type impurity base layer and a $p^+$-type impurity layer formed thereon, and
   in each of said unit cells comprises
   photoelectric converters,
   plural selection means respectively connected to said photoelectric converters and selecting one of output signals from said photoelectric converters, and
   output means for receiving one of the output signals from said photoelectric converters which is selected by said plural selection means, amplifying the output signal, and outputting an amplified signal.

17. A driving method for a MOS-type solid-state imaging apparatus comprising unit cells formed on a surface region of a semiconductor substrate, a first selector for selecting a row of the unit cells at a first interval, a second selector for selecting a column of the unit cells at a second interval which is shorter than the first interval, each of said unit cells comprising photoelectric converters for generating charges corresponding to incident light, plural selection means respectively connected to said photoelectric converters and selecting one of output signals from said photoelectric converters, and signal output means for receiving one of the output signals from said photoelectric converters which is selected by said plural selection means, amplifying the output signal, and outputting an amplified signal, the output means being activated in synchronization with the first selector, in which said signal output means performs an operation of outputting the amplified signal at least twice in one frame interval of a television signal.

18. A MOS-type solid-state imaging apparatus according to claim 1, further comprising means for compensating for variations in amplification characteristics of said output means of said unit cells.

19. A MOS-type solid-state imaging apparatus according to claim 18, in which said means for compensating comprises a noise canceler for subtracting a noise component from an output from each of said unit cells.

20. A MOS-type solid-state imaging apparatus according to claim 18, in which said means for compensating comprises a noise canceler for subtracting a charge representing a noise component from a charge representing an output from each of said unit cells.

21. A MOS-type solid-state imaging apparatus according to claim 18, in which said means for compensating comprises a source follower circuit to which an output signal from each of said unit cells is supplied, a sample/hold capacitor to which an output signal from said source follower circuit is supplied through a sample/hold transistor and a clamp capacitor, and the sample/hold transistor connected to a connection point between said sample/hold capacitor and said clamp capacitor to turn on/off the connection point.

22. A MOS-type solid-state imaging apparatus according to claim 21, in which said sample/hold capacitor and said clamp capacitor are stacked on each other.

23. A MOS-type solid-state imaging apparatus according to claim 18, in which said means for compensating comprises a sample/hold capacitor to which an output signal from each of said unit cells is supplied through a clamp capacitor and a sample/hold transistor, and a clamp transistor connected to a connection point between said clamp capacitor and said sample/hold transistor to turn on/off said clamp capacitor.

24. A MOS-type solid-state imaging apparatus according to claim 23, in which said means for compensating comprises correction means for reducing a difference between impedances of said clamp capacitor in ON and OFF periods.

25. A MOS-type solid-state imaging apparatus according to claim 24, in which said correction means comprises a correction capacitor for increasing a capacitance of said clamp capacitor when said clamp transistor is off.

26. A MOS-type solid-state imaging apparatus according to claim 18, in which said compensation means comprises a source follower circuit to which an output signal from each of said unit cells is supplied, a sample/hold capacitor to which an output signal from said source follower circuit is supplied through a clamp capacitor and a sample/hold transistor, and a clamp transistor connected to a connection point between said clamp capacitor and said sample/hold transistor to turn on/off said clamp capacitor.

27. A MOS-type solid-state imaging apparatus according to claim 18, in which said means for compensating comprises a slice transistor having a gate to which an output signal from each of said unit cells is supplied, a slice capacitor and a slice reset transistor which are connected to a source of said slice transistor, and a slice charge transfer capacitor and a drain reset transistor which are connected to a drain of said of said slice transistor.

28. A MOS-type solid-state imaging apparatus according to claim 18, in which said means for compensating comprises a sample/hold capacitor to which an output signal from each of said unit cells is supplied through a sample/hold transistor and a clamp capacitor, and the sample/hold transistor connected to a connection point between said sample/hold capacitor and said clamp capacitor to turn on/off the connection point.

* * * * *

UNITED STATES PATENT AND TRADEMARK OFFICE
CERTIFICATE OF CORRECTION

PATENT NO.   : 6,091,449
DATED        : July 18, 2000
INVENTOR(S)  : Yoshiyuki Matsunaga et al.

It is certified that error appears in the above-identified patent and that said Letters Patent is hereby corrected as shown below:

<u>Title page,</u>
Item [75], Inventors, should read as follows:
-- [75] Inventors: Yoshiyuki Matsunaga, Kamakura; Shinji Ohsawa, Ebina; Nobuo Nakamura, Fuchu; Hirofumi Yamashita, Tokyo; Hiroki Miura; Nagataka Tanaka, both of Yokohama; Keiji Mabuchi, Kawasaki, all of Japan --
Item [63], Related U.S. Application Data, should read as follows:
            -- Related U.S. Application Data
[63]   Continuation of application No. PCT/JP96/02281, Aug. 12, 1996. --

Signed and Sealed this

Twenty-fourth Day of May, 2005

JON W. DUDAS
*Director of the United States Patent and Trademark Office*